United States Patent [19]

Murakami et al.

[11] Patent Number: 5,471,427

[45] Date of Patent: * Nov. 28, 1995

[54] CIRCUIT FOR REPAIRING DEFECTIVE BIT IN SEMICONDUCTOR MEMORY DEVICE AND REPAIRING METHOD

[75] Inventors: Shuji Murakami; Tomohisa Wada; Kenji Anami, all of Hyogo, Japan

[73] Assignee: Mitsubishi Denki Kabushiki Kaisha, Tokyo, Japan

[*] Notice: The portion of the term of this patent subsequent to Jul. 28, 2009, has been disclaimed.

[21] Appl. No.: 262,755

[22] Filed: Jun. 20, 1994

Related U.S. Application Data

[63] Continuation of Ser. No. 828,284, Jan. 30, 1992, which is a continuation of Ser. No. 500,965, Mar. 29, 1990, Pat. No. 5,134,585.

[30] Foreign Application Priority Data

Jun. 5, 1989 [JP] Japan ................................ 1-142450

[51] Int. Cl.$^6$ ............................ G11C 7/00; G11C 29/00
[52] U.S. Cl. ............................ 365/200; 365/225.7
[58] Field of Search ................................ 365/200, 225.7

[56] References Cited

U.S. PATENT DOCUMENTS

| | | | |
|---|---|---|---|
| 4,389,715 | 6/1983 | Eaton, Jr. et al. | 365/200 |
| 4,587,638 | 5/1986 | Isobe et al. | 365/200 |
| 4,587,639 | 5/1986 | Aoyama et al. | 365/200 |
| 4,641,285 | 2/1987 | Sasaki et al. | 365/200 X |
| 4,691,301 | 9/1987 | Anderson | 365/200 |
| 4,703,436 | 10/1987 | Varshney | 365/200 |
| 4,707,810 | 11/1987 | Ferrant | 365/200 |
| 4,729,117 | 3/1988 | Osaka | 365/200 |
| 4,761,767 | 8/1988 | Ferrant | 365/200 |
| 4,791,319 | 12/1988 | Tagami et al. | 365/200 |
| 4,847,810 | 7/1989 | Tagami | 365/200 |
| 4,918,662 | 4/1990 | Kondo | 365/200 |
| 4,967,394 | 10/1990 | Minigawa et al. | 365/201 |
| 5,134,585 | 7/1992 | Murakami et al. | 365/200 |

FOREIGN PATENT DOCUMENTS

| | | |
|---|---|---|
| 0090331 | 3/1983 | European Pat. Off. . |
| 0300467 | 7/1988 | European Pat. Off. . |
| 61-61300 | 3/1986 | Japan . |

*Primary Examiner*—David C. Nelms
*Assistant Examiner*—Son Dinh
*Attorney, Agent, or Firm*—Lowe, Price, LeBlanc & Becker

[57] ABSTRACT

A circuit for repairing a defective memory cell is provided between a row or column decoder and a memory cell array. When the decoder has n output lines, the memory cell array includes at least (N+1) row or column lines, where n is an integer. The repair circuit includes connection circuit for connecting the output lines of the decoder to the row or column lines, and a circuit for defining the connection of the connection circuit. The connection circuit includes n switching elements each of which is operable to connect one output line of the decoder to at least two row or column lines. The defining circuit defines the connection path of each switching element such that the output lines of the decoder is connected in one to one correspondence to successively located row or column lines excluding a row or column line connecting a defective memory cell. The defining circuit includes a series of laser programmable fuse elements provided between an operation voltage supply and a ground line. The repair circuit occupies a reduced area of a chip because of no spare decoder and nor program circuit and it carries out a reliable and fast memory repair because of the reduced number of the fuse elements to be blown off.

2 Claims, 14 Drawing Sheets

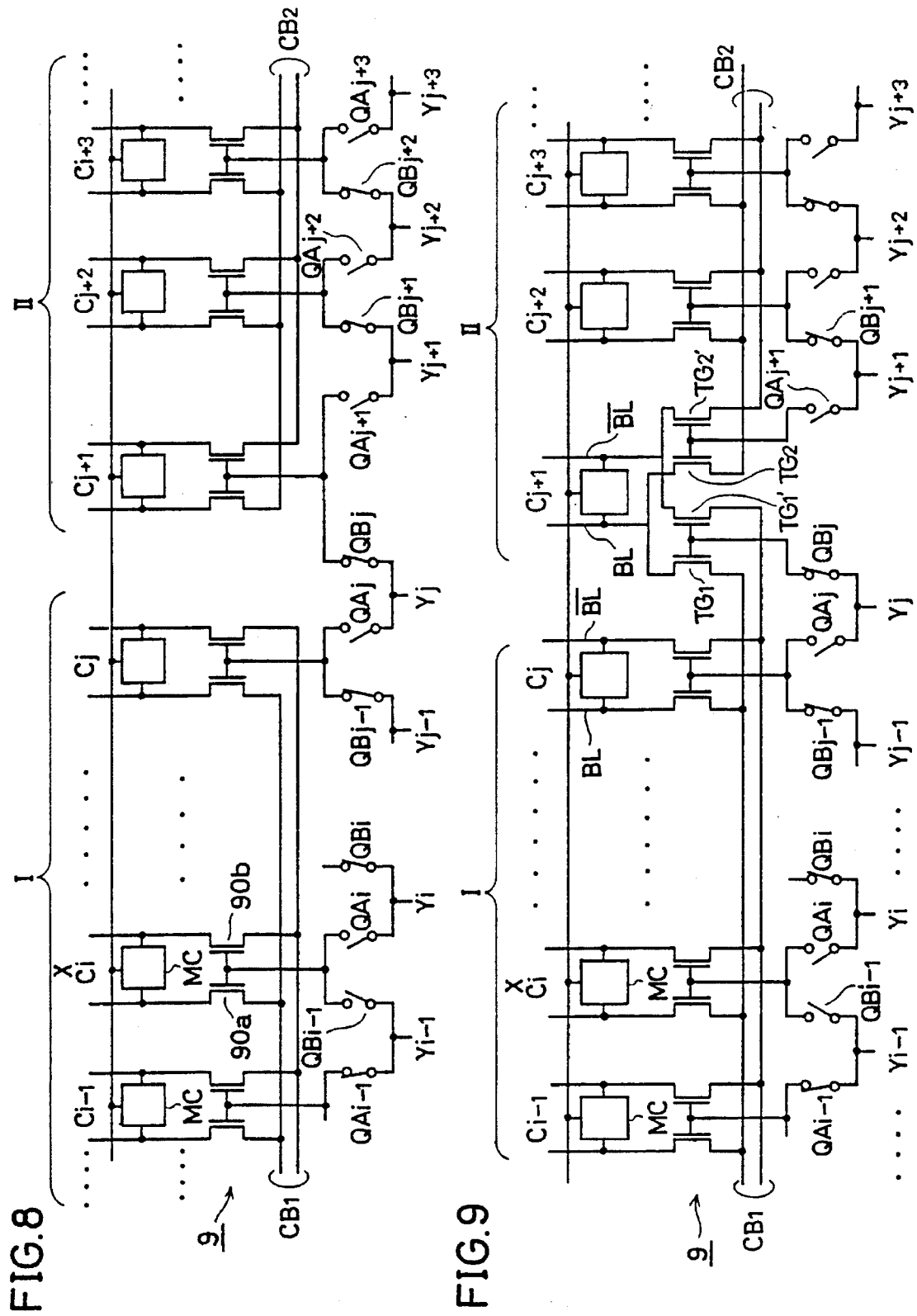

CIRCUIT FOR REPAIRING DEFECTIVE BIT IN SEMICONDUCTOR MEMORY DEVICE AND REPAIRING METHOD

This application is a continuation of application Ser. No. 07/828,254 filed Jan. 30, 1992, which is a continuation of application Ser. No. 07/500,965 filed Mar. 29, 1990 U.S. Pat. No. 5,134,585.

BACKGROUND OF THE INVENTION

1. Field of the Invention

The present invention relates to an improvement of a circuit structure for repairing a defective bit in a semiconductor memory device.

2. Description of the Background Art

Generally, in a semiconductor memory device, spare rows and spare columns are provided in a memory cell array in order to repair defective bits so as to improve production yield.

FIG. 1 schematically shows a whole structure of a conventional semiconductor memory device having a redundant bit structure.

Referring to FIG. 1, the conventional semiconductor memory device comprises a memory cell array 1 having a plurality of memory cells MC arranged in n rows and n columns. N rows (word lines) R1 to Rn each having connected thereto a row of memory cells, and n columns (bit line pairs) C1 to Cn each having connected thereto a column of memory cells are arranged in the memory cell array 1. A spare row SR and a spare column SC are provided to repair a defective bit (memory cell) at prescribed positions (in FIG. 1, at the first row and (n+1)-th column) of the memory cell array 1.

The rows R1 to Rn are respectively connected to output signal lines X1 to Xn of a row decoder 3. The row decoder 3 decodes externally applied X address signals (row address signals) A0 to Ak to activate one of the output signal lines X1 to Xn.

The columns C1 to Cn are respectively connected to output signal lines Y1 to Yn of a column decoder 6. The column decoder 6 decodes externally applied Y address signals (column address signals) B0 to Bm to select one of the output signal lines Y1 to Yn to activate the selected output signal line. The output signals Y1 to Yn of the column decoder 6 are applied to gates of column selection gates 90a, 90b in order to selectively connect the columns C1 to Cn to a common data line (not shown) in response to an output signal from the column decoder 6.

The column selection gate 90a connects a bit line BLj of a column CJ (j=1 to n) to the common data line, and the column selection gate 90b connects a complementary bit line $\overline{BLj}$ of the column CJ to a complementary common data line. The group of gates formed of the column selection gates 90a and 90b constitute a column selection gate 9. The output signals from the column decoder 6 are transmitted to the column selection gate 9 through fuses (fusible element) f1 to fn. The fuses f1 to fn can be melt by, for example, a laser beam. A high resistance r is provided in parallel to each of the fuses f1 to fn in order to maintain, when the fuse is melt, the gate potential of the column gates 90a and 90b connected to the melt fuse at the ground potential level.

In order to repair a row including a defective bit (memory cell), a programming circuit 30, a spare row decoder 31 and a spare row driver SXD are provided. An example of this structure is disclosed in, for example, 1982 IEEE ISSCC Digest of Technical Papers, February, 1982, pp. 252 to 253 by Smith et al. The programing circuit 30 stores the address of the row including a defective bit. Generally, the programming circuit 30 has the same structure as a unit row decode circuit constituting the row decoder 3, and in most cases, a fuse included therein is melt by a laser beam so as to store the address of the row including the defective bit. The spare row decoder 31 outputs a spare row selecting signal as well as a signal NED to render the row decoder 3 inactive in response to an activating signal from the programming circuit 30. The row driver SXD drives the spare row SR in response to the spare row selecting signal from the spare row decoder 31 to set the spare row SR at a selected state.

A programming circuit 61 and a spare column decoder 60 are provided for selecting a spare column (redundant column) SC. The programming circuit 61 stores the address of the column including a defective bit and, when an external Y address signals B0 to Bm designate the column including the defective bit, outputs an activating signal. The spare column decoder 60 outputs a signal for selecting the spare column SC in response to the activating signal from the programming circuit 61. The operation will be described in the following.

First, the operation where there is no defective memory cell will be described. The row decoder 3 decodes the externally applied X address signals A0 to Ak and outputs a signal for selecting one of the rows R1 to Rn to one of the output signal lines X1 to Xn. Consequently, the potential of the row Ri (the selected row is represented as Ri) rises, so that the row Ri is set at the selected state. Accordingly, the information in the memory cells MC connected to the selected row Ri is read to each of the columns C1 to Cn. Then, signal potential of one of the output signal lines Y1 to Yn rises in response to the decoded Y address signal from the column decoder 6. Now, the selected column is represented as Ci. On this occasion, the potential of the output signal line Yi of the column decoder 6 rises, the column selection gates 90a and 90b are set at the on state, and column Ci is connected to the common data line. Thereafter, reading or writing of data from or to the memory cell positioned at the intersection of the selected row Ri and the selected column Ci is carried out.

Now, let us assume that a defective memory cell exists in the memory cells connected to the row Ri. The presence/absence of the defective memory cell is found through a function test of the semiconductor memory device. First, the address of the row Ri having a defect is written in the programming circuit 30 for repairing the row. The writing of the address into the programming circuit 30 is generally carried out by cutting a fuse by a laser, as described above. When externally applied X address signals A0 to Ak designate the row Ri, then the programming circuit 30 is activated and the spare row decoder 31 operates. The spare row decoder 31 in operation sets the spare row SR at the selected state through the spare row driver SXD and activates the signal NED, so as to inactivate the row decoder 3. Consequently, the row Ri including the defective memory cell is replaced by the spare row SR, whereby the row Ri is repaired.

Now, let us assume that a defective memory cell exists in a column Ci. In that case, the address of the column Ci including the defective memory cell is written by cutting a fuse, for example, to the programming circuit 61 for repairing the column, as in the case of repairing the row. At that time, the fuse fi connected to the output signal line Yi for selecting the column Ci including the defective memory cell is also cut, so that defective column Ci is cut away from the column decoder 6. Consequently, the column Ci including the defective memory cell is kept at the non-selected state. When the externally applied Y address designates the column Ci, the spare column decoder 60 operates through the programming circuit 61, whereby the spare column SC is selected. Therefore, the column Ci including the defective memory cell is replaced by the spare column SC, and the defective column Ci is repaired.

The defective bit repairing circuit in the conventional semiconductor memory device is structured as described above in which the programming circuits, the spare row decoder, the spare column decoder and the like are necessary, increasing the area of the chip.

The programming of the address in the programming circuit is generally carried out by cutting of a fuse. However, as shown as an example in the aforementioned article, there are a large number of fuses included in the programming circuit, and a number of fuses must be cut for programming a defective row or column. Since the programming of a defective row or column is carried out chip by chip in this system, the throughput may be reduced and errors in cutting the fuses may be generated during the repairing process, which leads to lower success rate in repair, and accordingly to reduced production yield of the semiconductor memory device.

When a defective row is selected and to be repaired, the row decoder is made inactive by a signal NED from a spare row decoder. Namely, the row decoder is once activated and thereafter inactivated in response to the signal NED, which means that the row including the defective memory cell (bit) is also selected once. In order to prevent influences effected by the state of selection of the row including the defective bit, it is necessary to connect a selected memory cell to the common data line after the signal potential of the selected row becomes stable, which increases the time of access.

A redundancy scheme for repairing a defective cell in a memory device is disclosed in S. S. Eaton, Jr's U.S. Pat. No. 4,389,715, "An Ultralow Power 8K×8-Bit Full CMOS RAM with a Six-Transistor Cell", by K. Ochii et al. IEEE Journal of Solid-State Circuits, Vol. SC-17, No. 5, October 1982, pp 798 to 803, and in Japanese Patent Publication No. 61-35636.

U.S. Pat. No. 4,389,715 discloses a memory device including a circuit for storing row or column address of a defective memory cell provided for an address buffer, a circuit for comparing the output from the address buffer and the stored address in the storing circuit, and a circuit for selecting spare cells in response to the output from the comparing circuit.

The article of Ochii et al discloses a redundancy circuit of 1 row and 2 columns for repairing defective cells. The redundancy circuit has a program circuit in which an address of a defective row or column is programmed by cutting of a fuse by means of laser. The program circuit is provided with a spare enable latch for preventing DC current.

Japanese Patent Publication (Kokoku) No. 61-35636 discloses a memory device having a switch circuit provided between a row or a column and a decoder output. The switching circuit has a fuse, and selection/non-selection of a corresponding row or column is determined by cutting this fuse.

SUMMARY OF THE INVENTION

An object of the present invention is to provide an improved defective bit repairing circuit eliminating drawbacks of the above described conventional row and column repairing circuit structure.

Another object of the present invention is to provide a defective bit repairing circuit capable of improving throughput and success rate of repair in the row or column repairing process.

A further object of the present invention is to provide a defective bit repairing circuit capable of reducing access time.

A still further object of the present invention is to provide a defective bit repairing circuit capable of repairing row or column accurately and in a simple manner by reducing the number of fuses to be cut for repairing defective rows and columns.

A still further object of the present invention is to provide an improved method of repairing defective bits.

In the defective bit repairing circuit of a semiconductor memory device in accordance with the present invention, at least (n+1) rows or columns are provided for n row or column decoder output signal lines, and selecting means is provided between the decoder circuit output signal lines and the column or row lines. The selecting means includes means for connecting one decoder circuit output signal line selectively to one of a plurality of column or row lines. A defining circuit is provided for defining the manner of connection of the connecting means. The defining circuit defines the manner of connection of the connecting circuit such that the decoder circuit output signal lines are connected to successively adjacent row or column lines in one to one correspondence except a column or row line including a defective bit.

More specifically, the defective bit repairing circuit of the semiconductor memory device in accordance with the present invention comprises selecting means for connecting each output signal line of a decoder circuit having n output signal lines selectively to one of two adjacent column or row lines. The selecting means is constituted by switching means, and the defining circuit defines the manner of connection thereof such that the connection path of the switching means in a first set of output signal lines including a decoder circuit output signal line corresponding to a column or row with a defective bit is made different from that in a second set of remaining output signal lines.

A second defective bit repairing circuit in accordance with the present invention has a structure in which a plurality of a selecting means described above are cascade connected.

A third defective bit repairing circuit in accordance with the present invention comprises selecting means provided between n decoder circuit output signal lines and (n+2) column or row lines. The selecting means connects the i-th output signal line Xi (Yi) counted from one side of the decoder circuit to either the i-th or (i+1)-th column or row line counted from the same side. When there is no defective bit, the selecting means connects the first to n-th output signal line of the decoder circuit to the first to n-th column or row lines. When there is a defective memory cell on the i-th column or row line, the selecting means connects the first to (i−1)-th output signal lines of the decoder circuit to the first to (i− 1)-th column or row lines s and connects the i-th to n-th output signal lines of the decoder circuit to the (i+1)-th to (n+1)-th column or row lanes. The switching of connection is simply carried out by reverting a connection path in each switching means.

A fourth defective bit repairing circuit in accordance with the present invention comprises selecting circuits arranged between n decoder circuit output signal lines and (n+2)

column or row lines. Each of the selecting circuits comprises switching means provided corresponding to each of the decoder circuit output signal lines. The switching means connects the i-th output signal line counted from one side of the decoder circuit selectively to the i-th column or row line or (i+2)-th column or row line. A defining circuit is provided for defining the connection path of the selecting means. When there is a defective memory cell on the i-th column or row line and on the (i+1)-th column or row line, the defining circuit sets the connection path of the switching means connected to each of the i-th decoder circuit output signal line to n-th decoder circuit output signal line such that it is reversed to the connection path of the switching means connected to the first to (i−1)-th output signal lines.

A fifth defective bit repairing circuit of the present invention comprises a selecting circuit arranged between a decoder circuit having n output signal lines and (n+2) column or row lines. The selecting circuit comprises switching means for selectively connecting one output signal line of the decoder circuit to one of three continuous adjacent column or row lines. When there is a defective bit on the i-th column or row line, the defining circuit changes the manner of connection of the switching means in a first set of output signal lines including the decoder circuit output signal line corresponding to the defective bit from that in the set of remaining decoder output signal lines.

When there is a defective memory cell on the j-th column or row line connected to the output signal line included in the first set of output signal lines, the defining circuit switches the manner of connection in a third set of output signal lines including the output signal line corresponding to the defective column or row line and from that in the set of remaining decoder output signal lines. The manner of connection of the switching means in the third set, the manner of connection of the switching means in the remaining output signal lines in the first set and the manner of connection of the switching means of the output signal lines not included in the first set are all different from each other.

The defining means preferably comprises a fuse provided corresponding to each switching means in series.

Each switching means connects the decoder circuit output signal lines to successively adjacent column or row lines in one to one correspondence except a column or row line including a defective bit.

The switching of connection of the switching means is carried out simply by changing the manner of connection of each set of the switching means by the defining means. When the defining circuit comprises fuses, the manner of connection of the switching means can be changed by melting and cutting at a least one fuse. Therefore, the number of cut fuse in repairing a defective row or column can be significantly reduced and the repair of defective row or column can be carried out accurately and quickly in a simple manner.

In this structure, the selecting means is provided only between the decoder circuit and the column or row lines of the memory cell array, and the column or row line including the defective bit is separated from the row or column decoder circuit. Therefore, the row or column line including the defective memory cell is never selected, preventing increase of the access time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 shows a structure in which a column repairing circuit of the present invention is simply applied to the static type semiconductor memory device of the section type shown in FIG. 7;

FIG. 9 schematically shows a structure of a column repairing circuit in accordance with a fifth embodiment of the present invention;

DESCRIPTION OF THE PREFERRED EMBODIMENTS

Figure 2:
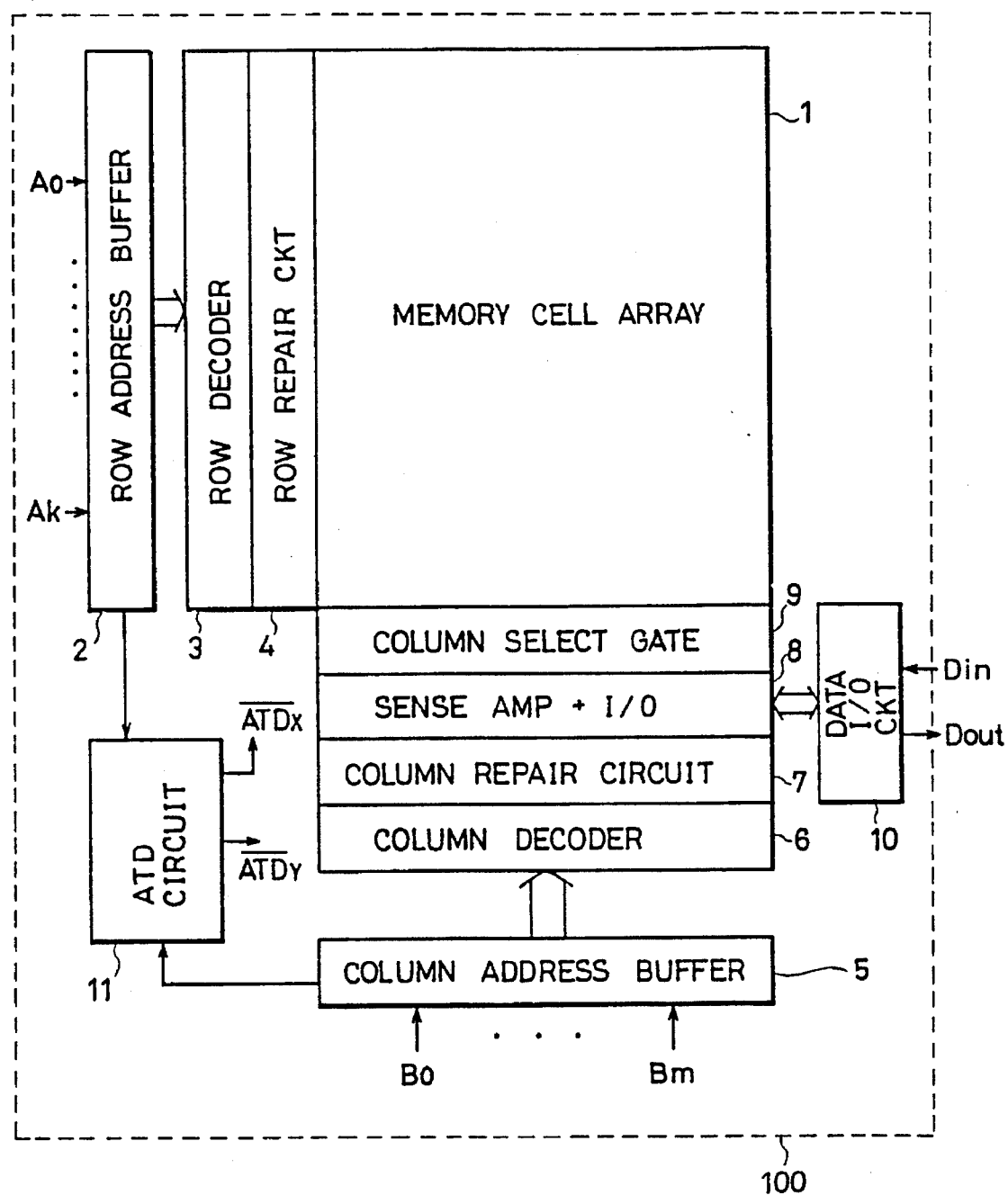
FIG. 2 shows an example of a schematic whole structure of a semiconductor memory device in accordance with the present invention.

FIG. 2 shows a schematic structure of a semiconductor memory device in a whole view in accordance with one embodiment of the present invention. Referring to FIG. 2, the semiconductor memory device comprises a memory cell array 1 in which memory cells are arranged in a matrix of columns and rows. The memory cell array 1 includes spare rows and columns, whose positions are not fixed as will described in detail later. A row address buffer 2, a row decoder 3 and a row repairing circuit 4 are provided for selecting a row of the memory cell array 1. The row address buffer 2 receives externally applied row address signals A0 to Ak and generates internal row address signals. The row decoder 3 decodes the internal address signals from the row address buffer 2, selects a corresponding row of the memory cell array 1 and transmits an activating signal to the selected row. The row repairing circuit 4 is provided between an output portion of the row decoder 3 and the rows of the memory cell array 1 and transmits the output from the row decoder 3 to each of the rows of the memory cell array 1 while maintaining a defective row in a non selected state.

A column address buffer 5, a column decoder 6, a column repairing circuit 7, a sense amplifier+I/O block 8 and a column selecting gate 9 are provided for selecting a column of the memory cell array 1. The column address buffer 5 receives externally applied column address signals B0 to Bm and generates internal column address signals. The column decoder 6 decodes the internal column address signals from the column address buffer 5 and generates a signal for selecting a corresponding column of the memory cell array 1. The column repairing circuit 7 maintains a defective column in a non-selected state, and transmits the output from the column decoder 6 to the column selecting gate 9. The column selecting gate 9 connects a corresponding column of the memory cell array 1 to a common data line in the block 8 in response to the selecting signal transmitted from the column repairing circuit 7. A sense amplifier included in the block 8 amplifies the information on the selected column.

A data input/output circuit 10 is provided for receiving and supplying data from and to an external device. The data input/output circuit 10 receives externally applied input data Din and transmits the same to a selected memory cell through the block 8. It receives data amplified in the block (sense amplifier) 8 and outputs the same as output data Dour.

An address transition detecting circuit 11 is provided for defining row selection and column selection timings in the semiconductor memory device. The address transition detecting circuit 11 monitors internal row addresses from the row address buffer 2, detects the time point of change thereof, and generates a row address change detection signal $\overline{ATDx}$. The address transition detecting circuit 11 receives internal column address signals from the column address buffer 5, detects the time of change of the column address signals and outputs a column address change detection signal $\overline{ATDy}$.

Although a static type random access memory is shown as an example of a semiconductor memory device in the embodiment of the present invention, the present invention may be applied to dynamic type random access memories and to any semiconductor memory devices in which memory cells are arranged in a matrix consisting of rows and columns.

A block 100 of the dotted lines in FIG. 2 represents a semiconductor chip.

Figure 3:
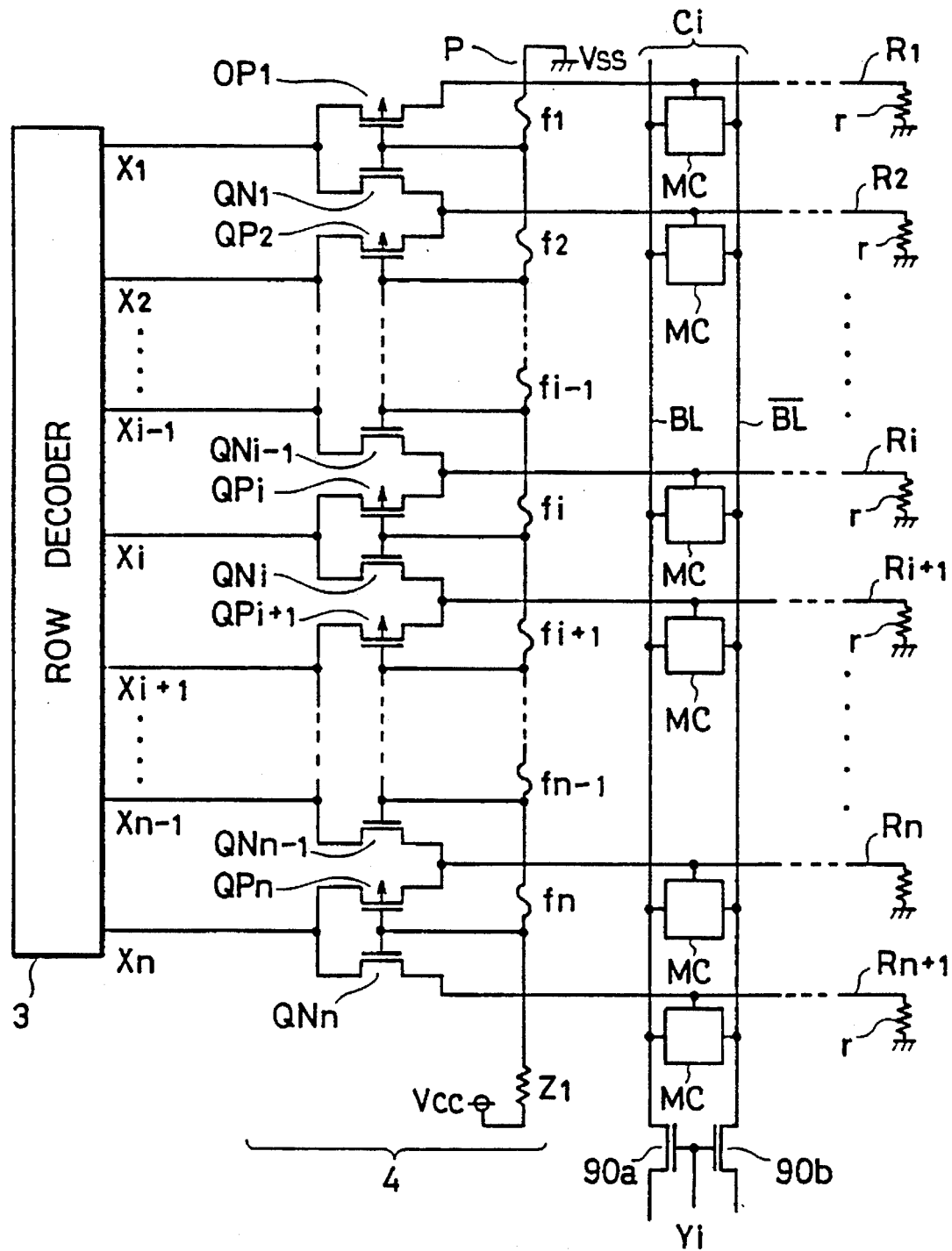
FIG. 3 shows an example of a structure of a row repairing circuit in accordance with one embodiment of the present invention.

FIG. 3 shows a specific structure of the row repairing circuit 4 of FIG. 2. Referring to FIG. 3, the memory cell array comprises one spare row. Therefore, it comprises n+1 row selecting lines R1 to Rn+1. A column Ci is shown as a representative in FIG. 3. The column Ci comprises a pair of complementary bit lines BL and $\overline{BL}$. A memory cell MC is provided at each of the intersections of the column Ci and the row selecting signal lines R1 to Rn+1. Transfer gate transistors 90a and 90b which are turned on in response to a column selecting signal Yi from the column decoder (6 in FIG. 2) are provided to the bit line pair BL, $\overline{BL}$ of the column Ci. When the transfer gate transistors 90a and 90b are set to on state, the column Ci is connected to the sense amplifier through a common signal line. A high resistance r is provided at the end portion of each of the rows R1 to Rn+1 in order to surely maintain the defective row at the ground potential level.

The row decoder 3 has n output signal lines X1 to Xn. In selecting a row, one of the output signal lines X1 to Xn is selected and activated by decoding operation of the row decoder 3.

The row repairing circuit 4 comprises p channel insulated gate type field effect transistors (hereinafter referred to as p type transistors) QP1 to QPN and n channel insulated gate type field effect transistors (hereinafter referred to as n type transistors) QN1 to QNn arranged to provide alternative connection of one row decoder output signal line to two rows. One conduction terminal of the p type transistor QPj (j=1 to n) and that of the n type transistor QNj are both connected to the same row decoder output signal line Xj. The other conduction terminal of the n type transistor QNj and that of the p type transistor QPj+1 are connected to the same row RJ+1. The p type transistor QP1 has the other conduction terminal connected to the first row R1. The n type transistor QNn has the other conduction terminal connected to the (n+1)-th row Rn+1.

The above described structure enables selective transmission of the output signal Xj (in the following description, the output signal line and the signal on the output signal line are represented by the same reference character) from the row decoder to two adjacent rows Rj and RJ+1.

A voltage supplying path P is provided for controlling on•off operations of the p type transistors QP1 to QPn and n type transistor QN1 to QNn. The voltage supplying path P has one end connected to receive the power supply potential Vcc and the other end connected to receive the ground potential Vss. The voltage supplying path P comprises a high resistance Z1 and fuses f1 to fn connected in series to each other. The high resistance Z1 has one end connected to receive the power supply potential Vcc and the other end connected to one end of the fuse and the gates of the transistors QPn and QNn. The fuses f1 to fn are provided corresponding to the rows R1 to Rn, and the fuses f1 to fn are connected in series in this order between the ground potential Vss and the high resistance Z1. The fuse fj has one end connected to the gates of the transistors QPj and QNj and the other end connected to the gates of the transistors QPj−1 and QNJ−1. The fuses f1 to fn can be melt and cut by using laser beam, for example.

The voltage supplying path P is arranged between the row selecting switches QP1 to QPn and QN1 to QNn and the memory cell array 1. The reason for this is that when the voltage supplying path P is provided on the side of the row decoder 3, the row decoder output signal line XJ and a signal line connected to the gates of the transistors QPJ and QNj from the voltage supplying path are overlapped with each other, making complicated the arrangement, manufacturing process and the layout of the signal lines. As shown in the figure, when the voltage supplying path P is provided on the side of the memory cell array, the row decoder output signal line and the signal line from the voltage supplying path P to the gate of each transistor can be arranged not overlapping with each other by the same pitch, simplifying the layout and the manufacturing process. The operation of the row repairing circuit 4 shown in FIG. 3 will be described in the following.

Now, let us assume that there is no defective bit found in the memory cell array by a function test of the semiconductor memory device. In that case, the fuse elements f1 to fn are all in the conductive state. Therefore, the potential Vss of the ground level is transmitted from the voltage supplying path P to the gates of the transistors QP1 to QPn and QN1 to QNn. Consequently, the p type transistors QP1 to QPn are set to the on state, while the n type transistors QN1 to QNn are all set to the off state. Accordingly, the output signal lines X1 to Xn from the row decoder 3 are connected to the rows R1 to Rn through the p type transistors QP1 to QPn, respectively. When a row is to be selected, the selected row is activated and the memory cells connected to the selected row are connected to the associated columns Ci.

Let us assume that there is a defective memory cell found in the memory cells connected to the row Ri as a result of a test of the semiconductor memory device. On this occasion, the fuse fi is cut off by using, for example, laser. In this case, the fuses f1 to fi–1 are connected to the ground potential Vss. Therefore, the on/off operations of the p type transistors QP1 to QPi–1 and the n type transistors QN1 to QNi–1 are the same as in the normal state. More specifically, the p type transistors QP1 to QPi–1 are set to the on state, while the n type transistors QN1 to Qni–1 are set to the off state.

Meanwhile, a high potential of the power supply potential Vcc level is transmitted to the gates of the p type transistors QPi to QPn and n type transistors QNi to QNn through the high resistance Z1. Consequently, the p type transistors QPi to QPn are set to the off state while the n type transistors QNi to QNn are set to the on state. Accordingly, the output signal lines X1 to Xi–1 of the row decoder 3 are connected to the rows R1 to Ri–1 through the p type transistors QP1 to QPi–1, while the signal lines Xi to Xn are connected to the rows Ri+1 to Rn+1 through n type transistors QNi to QNn, respectively. Consequently, the row Ri to which the defective memory cell is connected is always kept at the non-selected state, and thus the defective memory cell is repaired.

The row Ri including the defective memory cell is connected to the ground potential Vss through the high resistance r, so that it will not be in the electrically floating state even if it is electrically separated from the row decoder 3. By fixing the potential of the row including the defective memory cell to the ground potential through the high resistance r, it can be prevented that the potential of the separated defective row Ri is raised by influence of noise or the like to set the same to selected state. Even if the resistance r is connected to the terminal end portion of each of the rows R1 to Rn+1, there is no influence to the row charging operation in selecting the row, since each row is connected to the ground potential through the high resistance.

By the above described structure, the defective row can be repaired by cutting off only one fuse. In addition, in this structure, it is not necessary to set the row decoder 3 to the non-selected state and to operate the spare row decoder. Therefore, unlike the conventional structure, the row Ri including the defective memory cell is never selected and it is not necessary to generate the signal NED. Therefore, the access time is not increased, and the selection of row at high speed can be realized.

Although repair of a row is shown in the structure of FIG. 3, it goes without saying that the repairing circuit of the same structure can be used for repairing a column.

In the structure shown in FIG. 3, the high resistance Z1 is used as means for supplying the power supply potential Vcc to the voltage supplying path P. However, even if the power supply potential rises from 0V to Vcc when the power is turned on, the voltage is supplied to the voltage supplying path P through the high resistance Z1, so that the potential rise in the voltage supplying path P requires a long period of time. A structure for transmitting the power supply potential Vcc to the voltage supplying path P quickly is shown in FIG. 4.

Figure 4:
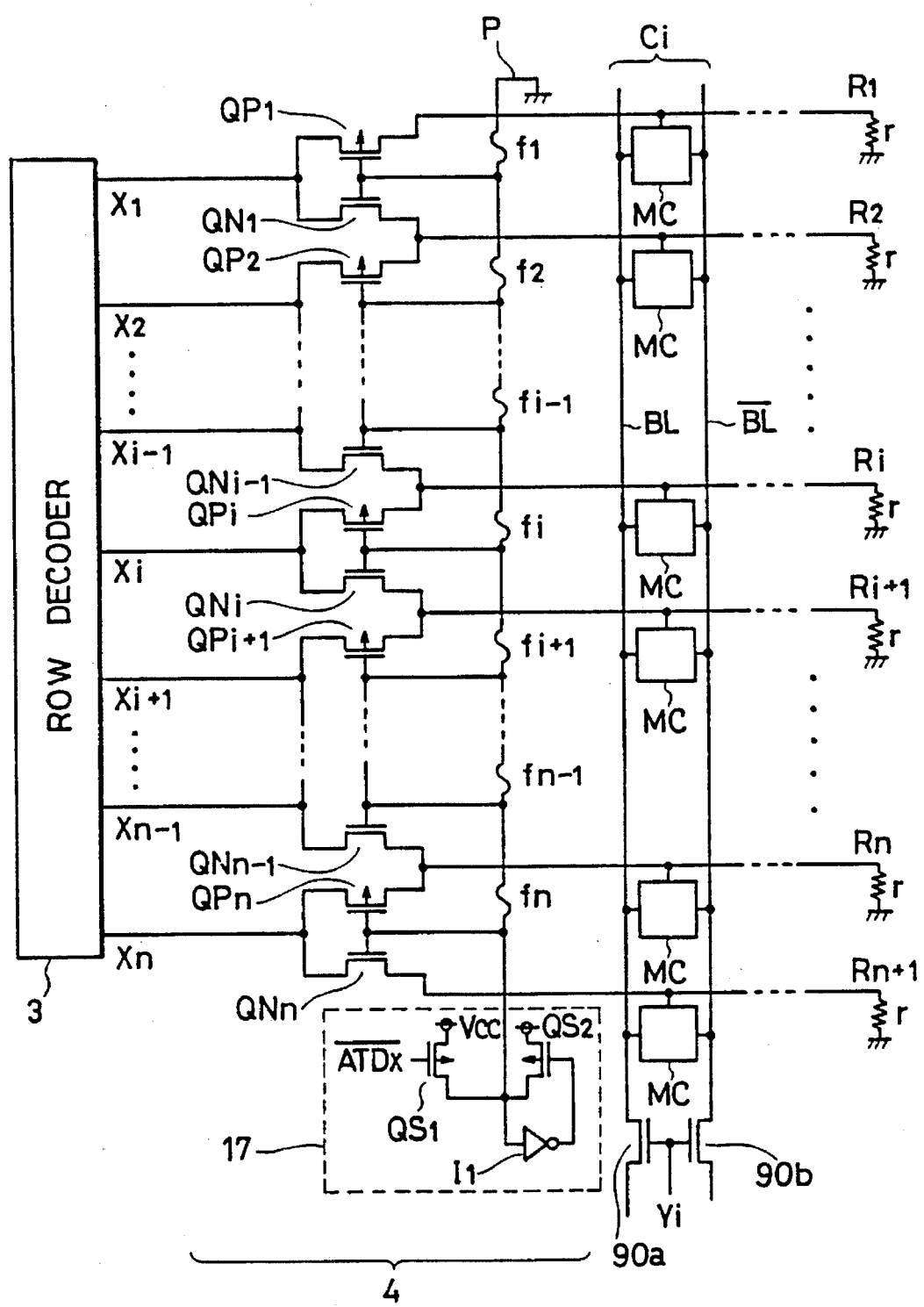
FIG. 4 shows a specific structure of a row repairing circuit in accordance with a second embodiment of the present invention.

Referring to FIG. 4, the potential setting circuit 7 for supplying the power supply potential Vcc to a voltage supplying path P comprises p type transistors QS1 and QS2 and an inverter I1. The transistor QS1 is turned on in response to an address change detection signal $\overline{ATDX}$ from the address transition detecting circuit 11, to transmit the power supply potential Vcc to the voltage supplying path P. The inverter I1 inverts the potential on the voltage supplying path P to apply the same to the gate of the p type transistor QS2. The p type transistor QS2 is turned on in response to the output from the inverter I1 and transmits the power supply potential Vcc to the voltage supplying path P. The inverter I1 and the p type transistor QS2 constitute a latch circuit for latching the potential of the voltage supplying path P. The on resistance of the p type transistor QS1 is set to be large in order that the potential of the voltage supplying path P is hardly increased when a fuse is not cut. The operation will be described in the following.

Figure 1:
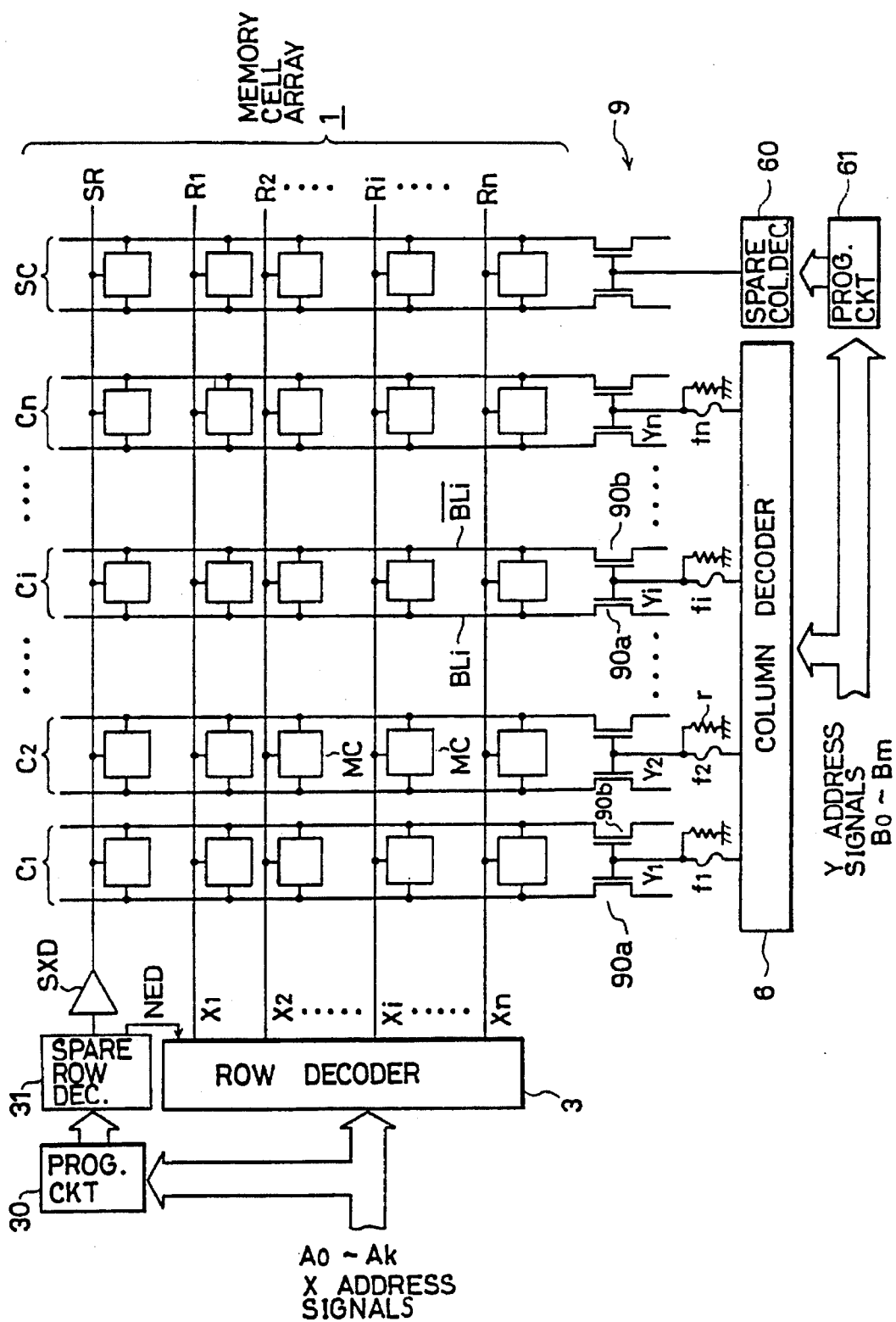
FIG. 1 schematically shows the whole structure of a conventional semiconductor memory device.

In a semiconductor memory device, when an externally applied address signal is changed, an address change detection signal $\overline{ATDx}$ is generated from the address transition detecting circuit 11 (see FIG. 1). The address change detection signal $\overline{ATDx}$ falls to the "L" level when a change of the address signal is detected. Therefore, in response to the address change detection signal $\overline{ATDx}$, the p type transistor QS1 is turned on to raise the potential of the voltage supplying path P. When all the fuses f1 to fn are conductive, the potential of the voltage supplying path P is approximately at the ground potential Vss level, since the on resistance of the p type transistor QS1 is set to be large.

Meanwhile, when any one of the fuses f1 to fn is cut, the potential of the portion cut away from the ground potential Vss of the voltage supplying path P is raised. When the raised potential of the voltage supplying path P exceeds the threshold value of the inverter I1, a signal of the ground potential Vss level is outputted from the inverter I1 to be applied to the gate of the p type transistors QS2. Consequently, the p type transistor QS2 is turned on to supply the power supply voltage Vcc to the voltage supplying path P. Since the on resistance of the p type transistor QS2 is not very large, the portion cut away from the ground potential Vss of the voltage supplying path P is quickly charged, and the potential thereof is quickly raised.

Once the p type transistor QS2 is set to the on state, the voltage of a prescribed portion of the voltage supplying path P is latched by a circuit portion of the p type transistor QS2 and the inverter I1, since the output from the inverter I1 is always at the ground potential Vss level. By such a potential setting circuit 17, the power supply potential Vcc can be quickly and stably applied to the voltage supplying path P in repairing a defective row.

In the structure shown in FIG. 4, a signal $\overline{ATDx}$ detecting the time of change of an row address signal is used as the address change detection signal defining the memory cycle from the address transition detecting circuit 11. However, when the address transition detecting circuit 11 detects both the time points of change in the row address and column address signals and provides only one address change detection signal $\overline{ATD}$, then the address change detection signal can be applied to the gate of the p type transistor QS1 to provide the same effect as in the above described embodiment.

Figure 5:
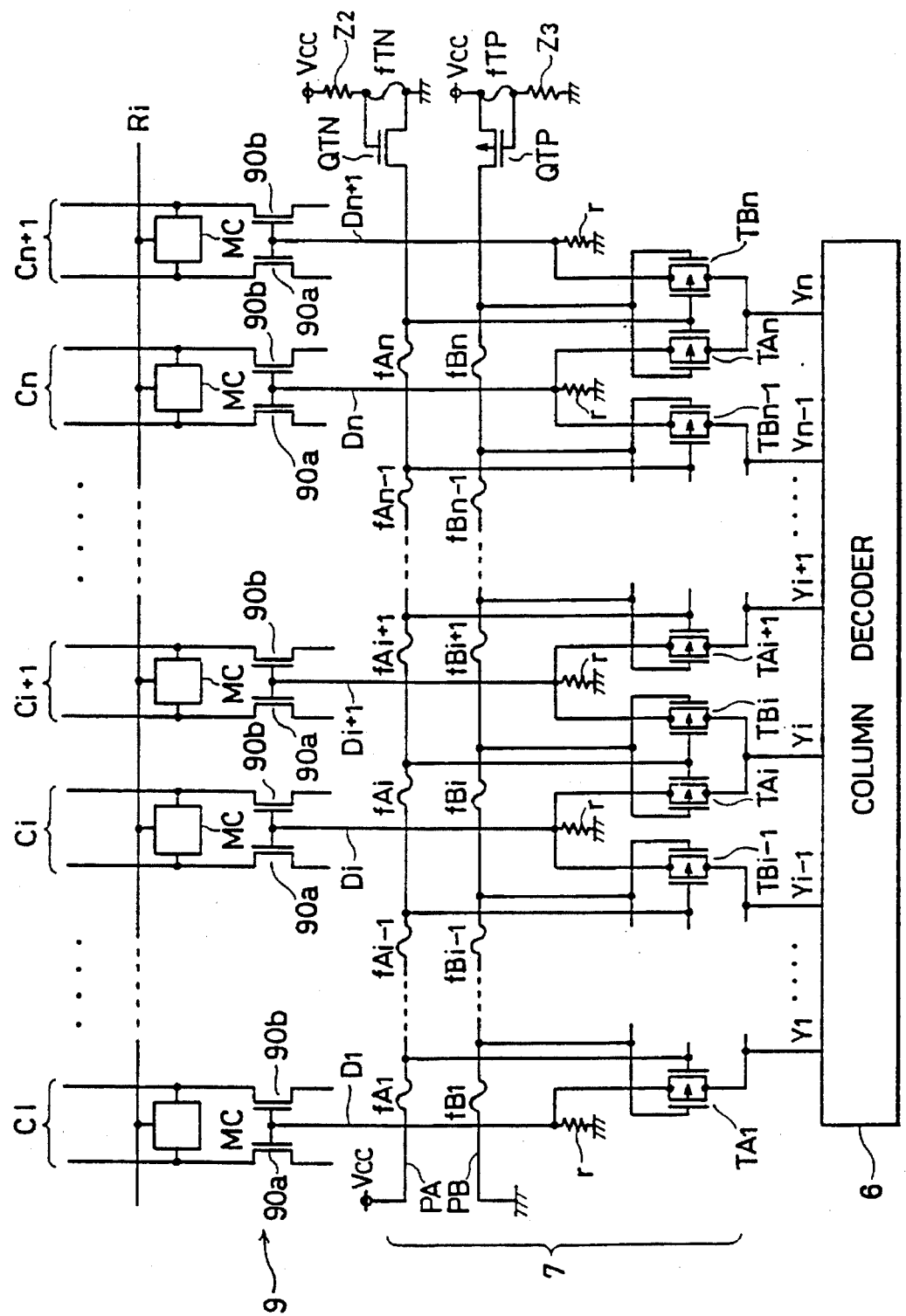
FIG. 5 shows a specific structure of a column repairing circuit in accordance with a third embodiment of the present invention.

In the structures shown in FIGS. 3 and 4, the row or column selecting signal is transmitted by using an insulated gate type transistor. In that case, what can be transmitted by the insulated gate type transistor is the signal of only the voltage level which is provided by subtracting the threshold voltage of itself from the voltage applied to the gate thereof. In addition, the transistor also functions as a resistor due to the on resistance of itself. Therefore, the amplitude of the decoder output is reduced in this transistor portion to be transmitted to the row or column selecting line. Therefore, the signal potential on the selected row or column selecting line has an insufficient value and the rise/fall time may be longer. In view of the foregoing, an example of a structure preventing the amplitude loss of the row or column selecting signal by such a repairing circuit is shown in FIG. 5. In the structure of FIG. 5, repair of a column is shown as an example. However, the structure is also applicable the repair of rows.

Referring to FIG. 5, the column repairing circuit 7 comprises transmission gates TA1 to TAn and TB1 to TBn for connecting the output signal lines Y1 to Yn of the column decoder 6 to the columns C1 to Cn+1, respectively, so as not to select a column including a defective memory cell (hereinafter referred to as a defective column). The transmission gates TAj (j=1 to n) and TBj (j=1 to n) each consist of a CMOS transmission gate in which a p type transistor and an n type transistor are connected in parallel. The transmission gate TAj connects the output signal line YJ of the column decoder 6 to a column Cj (more accurately, to a column selecting signal line Dj). The CMOS transmission gate TBj connects the output signal line Yj of the column decoder 6 to the column Cj+1 (or to the column selecting line Dj+1). Namely, in the structure of FIG. 5, the p type transistor QPj shown in FIGS. 3 and 4 is replaced by the CMOS transmission gate TAj and the n type transistor Qnj is replaced by the CMOS transmission gate TBJ.

Two voltage supplying paths PA and PB are arranged to render conductive the CMOS transmission gates TAj and TBj. The voltage supplying path PA has its one end connected to the power supply potential Vcc and its other end connected to the n type transistor QTn. Fuses fA1 to fan are arranged in series corresponding to the columns C1 to Cn between the one end of the voltage supplying path PA and the transistor QTN. The n type transistor QTN has its gate connected to the power supply potential Vcc through a resistance Z2 and to the ground potential Vss through a fuse fTN. The transistor QTn has the other conduction terminal connected to the column potential Vss.

The voltage supplying path PB has one end connected to the ground potential Vss and other end connected to one conduction terminal of a p type transistor QTP. Fuses fB1 to fBn are arranged in series corresponding to the columns between the one and the other ends of the voltage supplying path PB. The p type transistor QTP has the other conduction terminal connected to the power supply potential Vcc and its gate connected to the ground potential through a resistance Z3 and to the power supply potential Vcc through a fuse fTP.

The resistances Z2 and Z3 are both set to have a value which substantially prevents current from flowing to the fuses fTN and fTP, when the fuses fTN and fTP are conductive.

The fuses fAj and fBj are arranged in a pair. The fuse fAJ has one end connected to gates of the n type transistor of the CMOS transmission gate TAj and of the p type transistor of the CMOS transmission gate TBj. The fuse fAj has the other end connected to the gates of the n type transistor of the transmission gate TAj–1 and of the p type transistor of the transmission gate TBj–1. The fuse fBj has one end connected to the gates of the p type transistor of the CMOS transmission gate TAi and of the n type transistor of the transmission gate TBj. The fuse fBi has the other end connected to the gate of the p type transistor of the CMOS transmission gate TAj–1 and to the gate of the n type transistor of the transmission gate TBj–1.

The transmission gates TAj and TBj are of low impedance and have a function to transmit a signal with the amplitude not reduced, so that they can surely transmit the output signals from the column decoder 6 to corresponding columns.

The other end of each of the selecting signal lines D1 to Dn+1 for each column is connected to the ground potential Vss through a high resistance r. Accordingly, even when the defective column is cut away from the column decoder 6, it is avoided that the column selecting signal line is set to the floating state to raise the potential thereof by the influence of noise, which leads to erroneous column selection. The operation will be described in the following.

When there is no defective memory cell, the fuses fA1 to fan, fB1 to fBn, fTN and fTP are all at conductive state. In this state, the n type transistor QTN and the p type transistor QTP are both off. Consequently, the voltage supplying path PA is set to the power supply potential Vcc level, while the voltage supplying path PB is set to the ground potential Vss level. Therefore, the CMOS transmission gates TA1 to TAn are set to the on state, while the CMOS transmission gates TB1 to TBn are set to the off state. Accordingly, the output signal lines Y1 to Yn from the column decoder 6 are connected to the columns C1 to Cn through the transmission gates TA1 to TAn, respectively.

Let us assume that there is a defective memory cell on the column Ci. In that case, the fuses fAi and fBi are cut off and the fuses fTN and fTP are also cut off. Consequently, the n type transistor QTN and the p type transistor QTP are both set to the on state. Consequently, the portion of the fuses fA1 to fAi–1 is set to the power supply potential Vcc level and the circuit portion of the fuses fAi+1 to fAn is set to the ground potential Vss level in the voltage supplying path PA.

In the voltage supplying path PB, the circuit portion of the fuses fB1 to fBi–1 is set to the ground potential Vss level, and the circuit portion of the fuses fBi+1 to fBn is set to the power supply potential Vcc level.

As a result, the transmission gates TA to TAi–1 are set to the on state and the transmission gates TAi to TAn are set to the off state. At the same time, the transmission gates TB1 to TBi–1 are set to the off state and the transmission gates TBi to TBn are set to the on state. Therefore, the output signal lines Y1 to Yi–1 of the column decoder 6 are connected to the columns C1 to Ci –1 through the transmission gates TA1 to TAi–1, while the output signal lines Yi to Yn are connected to the columns Ci+1 to Cn+1 through the transmission gates TBi to TBn.

In the embodiment shown in FIG. 5, the column can be repaired by merely cutting four fuses, and column selection can be reliably carried out at high speed without reducing the amplitude of the column selecting signal.

This structure for repairing the column of FIG. 5 can naturally be applied for repairing a row. Namely, a structure for repairing the row can be provided by replacing the column selecting signal lines D1 to Dn+1 by the rows R1 to Rn+1 and by replacing the column decoder 6 by a row decoder 3.

As described above, in the structures of FIGS. 3 and 4, the row decoder 3 drives the rows R1 to Rn+1 through the transistors QP1 to QPn and QN1 to QNn. Therefore, because of the on resistance of the transistors, the rise/fall time of the potential of the selected row becomes longer, increasing the access time.

Figure 6:
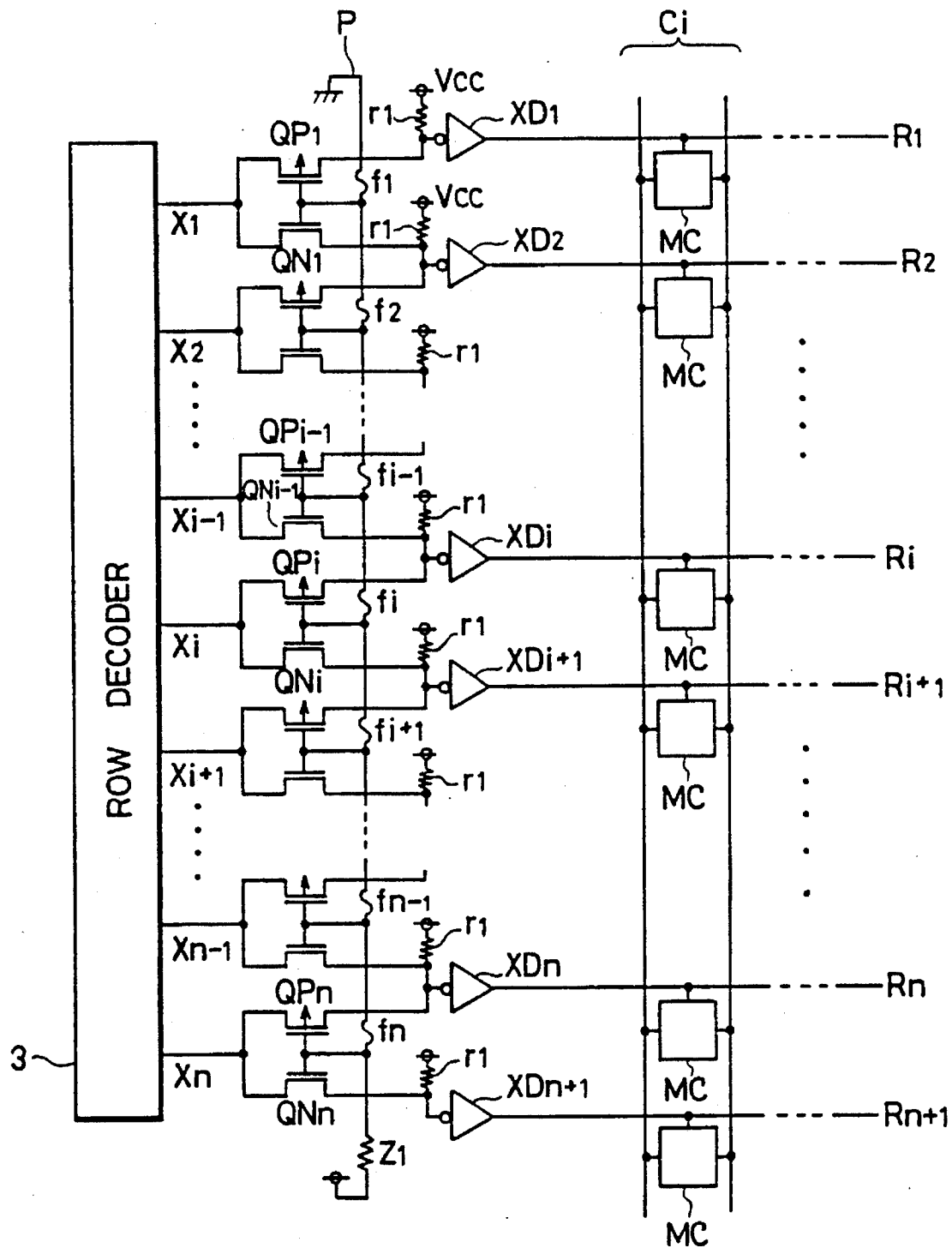
FIG. 6 shows a specific structure of a row repairing circuit in accordance with a fourth embodiment of the present invention.

In this case, drivers XD1 to XDn+1 are arranged between the transistors QP1 to QPn and QN1 to QNn and the respective rows, as shown in FIG. 6, in order to drive the rows at high speed. By doing so, the capability of driving the selected row is increased, and the potential of the selected row can be raised or lowered at high speed even when the row is driven by the row decoders through transistors QP1 to QPn and QN1 to QNn. In the structure shown in FIG. 6, each of the row drivers XD1 to XDn+1 is constituted by an inverter buffer with a pull up resistance r1 connected to the input portion thereof. What is shown here is a structure in which a row is selected when an output from the row decoder 3 attains to the "L" level. Therefore, in a structure in which a row is selected when the output from the row decoder 3 attains to the "H" level, each of the row drivers XD1 to XDn+1 is constituted by a simple buffer, and the resistance r1 is a pull down resistance connected to the ground potential Vss.

In a recent large capacity static type semiconductor memory device, the memory cell array is divided into a plurality of sections, a sense amplifier is provided for each section, and the output from the sense amplifier provided corresponding to the section is further multiplexed to be amplified by a second sense amplifier. Namely, in a large capacity memory cell array, the number of memory cells connected to one row is increased, and, accordingly, the number of memory cells connected to the common data line is also increased. In such case, the common data line becomes longer, the time of data transmission becomes longer, and the input load of the sense amplifier detecting the potential of the common data line is increased, whereby it becomes difficult to read data at high speed.

Figure 7:
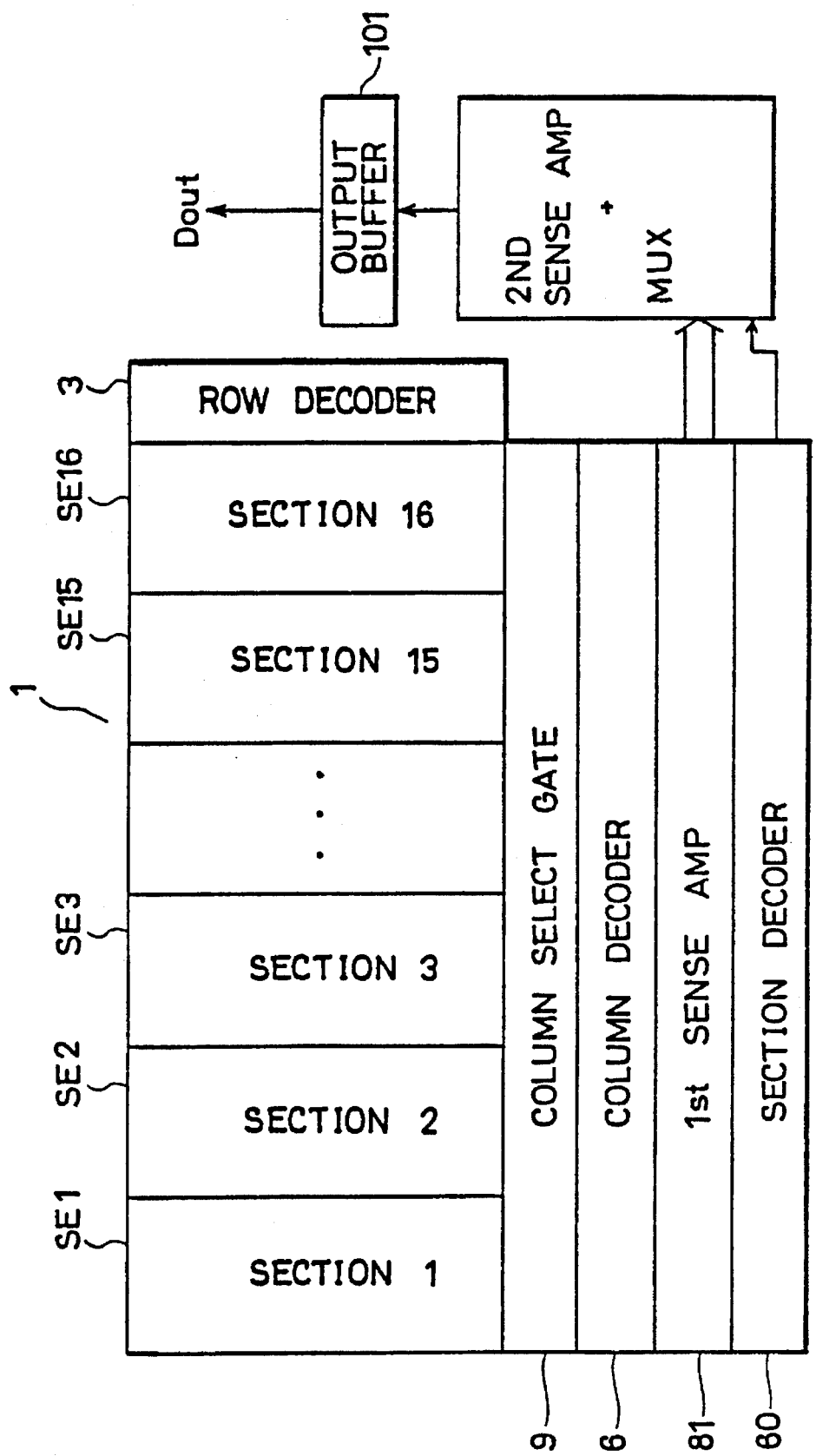
FIG. 7 shows a schematic whole structure of a large capacity static type semiconductor memory device in which the memory cell array is divided into plural sections.

Therefore, as shown in FIG. 7, a first sense amplifier is provided in each section of the memory cell array and the output of the first sense amplifier is multiplexed and further amplified by a second amplifier, so as to reduce the length of the common data line and the input load capacitance of the sense amplifier.

Referring to FIG. 7, a memory cell array 1 divided into 16 sections SE1 to SE16 is shown as an example. The row decoder 3 selects one row of the memory cell array sections SE1 to SE16. In this case, memory cells of one memory section or two sections are connected to one row. The column decoder 6 outputs a signal for selecting a corresponding column out of the memory sections SE1 to SE16 of the memory cell array 1. The column selecting gate 9 connects a selected column to the common data line provided corresponding to each section, in response to the column decoder output. The first sense amplifier 81 is provided corresponding to each of the memory cell sections SE1 to SE16 for amplifying the data from the corresponding section. A section decoder 60 decodes external address signal (4 bits of row address and column address signals) for selection of the memory cell section in which the memory cell to be selected is included. The second sense amplifier/multiplexer 82 amplifies the output of the selected first sense amplifier 81 to transmit the same to an output buffer 101, in response to a section selecting signal from the section decoder 60. The section decoder 60 is also functions to activate only the first sense amplifier corresponding to the selected section.

Instead of the above described structure, a reading circuit structure is sometimes used, which structure comprises common data lines provided for every several columns in each of the memory sections SE1 to SE16, a first sense amplifier provided corresponding to each common data line, a second sense amplifier provided corresponding to each memory section for amplifying the output from the first sense amplifier and a third sense amplifier provided commonly to the second sense amplifier for amplifying the output of the second sense amplifier.

A structure such as shown in FIG. 8 is obtained when the present invention is simply applied to the static type semiconductor memory device of a large capacity as described above. Referring to FIG. 8, columns to Cj belong to the section I and the columns from Cj+1 belong to the section II. Each of the columns belonging to the section I is connected to the common data line CB1 and the columns belonging to the section II are connected to the common data line CB2. The column decoder output Yk is connected to the column Ck or Ck+1 through a switching element QAk or a switching element QBk. The structure of FIG. 8 shows the circuit structure for repairing column by a simple switching element as an example.

Now, let us assume that a defective memory cell is connected to the column Ci. If according to the embodiment, in this case, the column Ci is cut away from the column decoder output signal line Yi, the column decoder output signal line Yi is connected to the column Ci+1 through the switch QBi, and the column decoder output signal line Yk (k>i) is connected to the column Ck+1 through a switching element QBk. Therefore, the connection of the column decoder output signal line Yj positioned at the boundary of this section is switched from the column Cj to the column Cj+1. The column Cj belongs to the section I, while the column Cj+1 belongs to the section II. Consequently, the data of the memory cell selected by the column decoder output Yj, which should be outputted to the common data line CB1, come to be outputted to the different common data line CB2, so that accurate reading of memory cell data can not be carried out.

In view of the foregoing, a structure must be provided in which the column decoder output signals and the memory cell section properly correspond to each other when a defective memory cell is to be repaired. FIG. 9 shows a structure capable of properly repairing a column even in the column section type semiconductor memory device.

Referring to FIG. 9, the bit line BL of the column Cj +1 positioned at the boundary between the section I and the section II is connected to the common data line CB1 through the transfer gate TG1 and to a common data line CB2 through a transfer gate TG2. The complementary bit line $\overline{BL}$ of the column Cj+1 is connected to the common data line CB1 through a transfer gate TG1' and to the common data line CB2 through a transfer gate TG2'. The gates of the transfer gates TG1 and TG1' are connected to a column decoder output signal line Yj through s switching element QBj. The gates of the transfer gates TG2 and TG2' are connected to a column decoder output signal line Yj+1 through a switching element QAj+1.

In this structure, when the switching element QBj is conductive and the switching element QAj+1 is non-conductive, the column Cj+1 is connected to the common data line CB1 through the transfer gates TG1 and TG1'. Meanwhile, when the switching element QBj is non-conductive and the switching element QAj+1 is conductive, the column Cj+1 is connected to the common data line CB2 through the transfer gates TG2 and TG2'. Therefore, even if the column Ci is defective and the column decoder output signal line Yj is connected to the column Cj+1, the column Cj+1 is connected to the section I by the transfer gates TG1 and TG1' enabling accurate reading or writing of the data.

When there is no defective memory cell, the column Cj +1 belongs to the section II, and therefore the column Cj +1 is connected to the common data line CB2 through the transfer gates TG2 and TG2'.

In the structure of each above described embodiment, a fuse corresponding to a defective row or column is cut so as to separate the defective row or column from the decoder output, and the decoder output signal line is shifted by one row or one column, whereby a defective row or column is repaired. However, in this structure, only one row or one column in a cell array can be repaired. A structure for repairing a plurality of rows or columns will be described in the following.

Figure 10B:
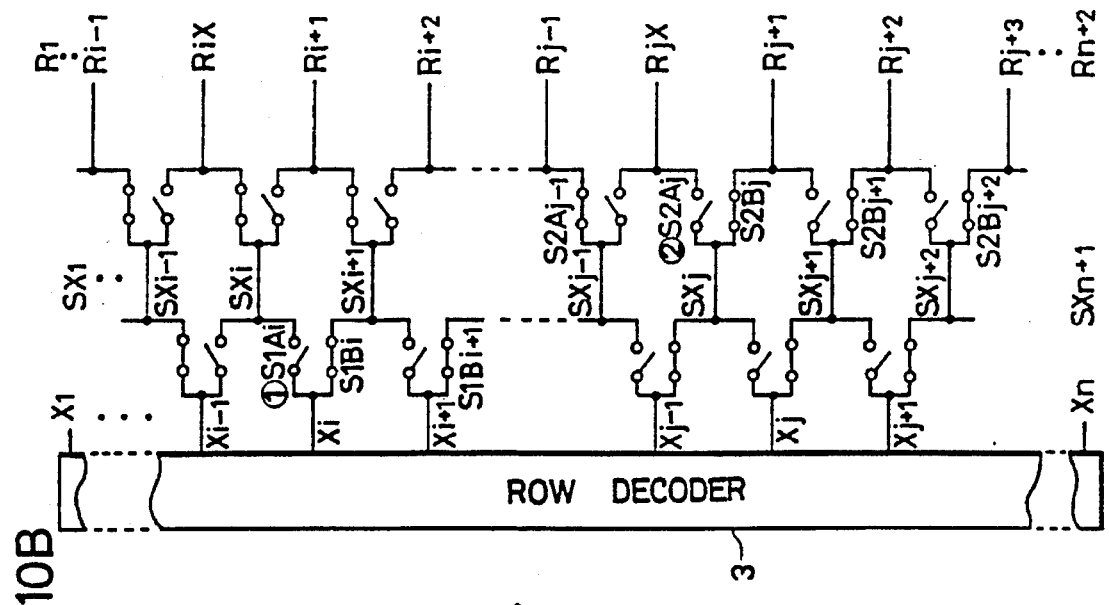
FIGS. 10A and 10B show a structure of a row repairing circuit in accordance with a sixth embodiment of the present invention.
Figure 10A:
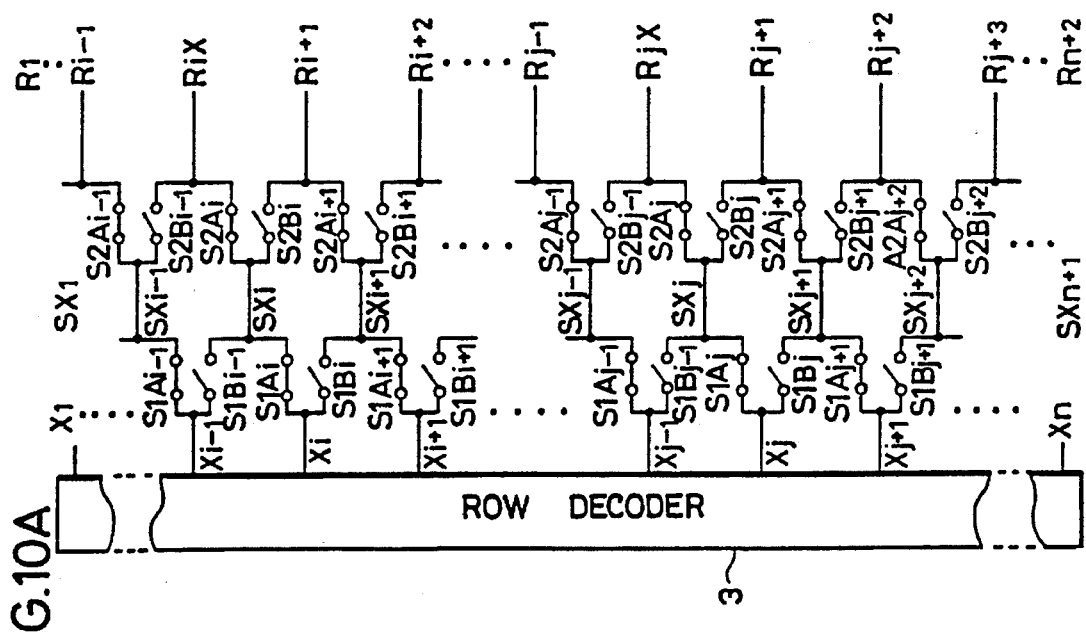

FIGS. 10A and 10B show a structure for repairing two rows in accordance with the present invention. In the structure of FIGS. 10A and 10B, two stages of the repairing circuit shown in FIG. 3 or 5 are cascade connected. In the structure of FIGS. 10A and 10B, a transistor providing switching means is simply represented as a mechanical switching element S. However, the state of conduction of each switching element is controlled by cutting of a fuse, as in the embodiment shown in FIG. 3 or 5.

Referring to FIG. 10A, n+1 sub rows SX1 to SXn+1 and n+2 rows R1 to Rn+2 are provided for output signal lines X1 to Xn of the row decoder 3. Switching elements S1A1 to S1An and S1B1 to S1Bn are arranged between the row decoder output signal lines X1 to Xn and the sub rows SX1 to SXn+1. The row decoder output signal line Xk (k=1 to n) is connected to a sub row SXk through the switching element S1Ak and to the sub row SXk+1 through the switching element S1Bk.

Switching elements S2A1 to S2An+1 and S2B1 to S2Bn +1 are arranged between the sub rows SX1 to SXn+1 and the rows R1 to Rn+2. The sub row SXk is connected to the row Rk through the switching element S2Ak and to the row Rk+1 through the switching element S2Bk.

When there is no defective memory cell in the semiconductor memory device, the switching elements S1A1 to S1An and S2A1 to S2An+1 are at the on state. Therefore, the row decoder output signal lines X1 to Xn are connected to the sub rows SX1 to SXn through the switching elements S1A1 to S1An, respectively. The sub rows SX1 to SXn are connected to the rows R1 to Rn through the switching elements S2A1 to S2An, respectively.

Now, let us assume that there are defective memory cells on the rows Ri and Rj. In this case, as shown in FIG. 10B, the switching element S1Ai connected to the row decoder output signal line Xi is brought into the off state and all the switching elements S1Bi to S1bn are set to the conductive state, as in the case shown in FIG. 3 or 5. Consequently, the row decoder output signal lines X1 to Xi−1 are connected to the sub rows SX1 to SXi−1, and the signal lines Xi to Xn are connected to the sub rows SXi+1 to SXn+1 through the switching elements S1Bi to S1Bn.

Thereafter, the switching elements from S2Aj provided between the sub row SXj and the row Rj to S2An+1 are set to the off state, and the switching elements S2Bj to S2Bn+1 are set to the on state. Consequently, the sub rows SX1 to SXj−1 are connected to the rows R1 to Rj−1 and the sub rows SXj to SXn+1 are connected to the rows Rj+1 to Rn+2.

In this case, the sub row SXi is connected to the row Ri. However, the sub row SXi has already been cut away from the output signal lines Xi−1 and Xi to repair the row Ri, and the row Rj has been cut away from the sub rows SXj−1 and SXj to repair the defective row Rj. Under this condition, the row decoder output signal lines X1 to Xi−1 are connected to the rows R1 to Ri−1, and the output signal line Xi is connected to the row Ri+1. The row decoder output signal lines Xi+1 to Xj−2 are connected to the row Ri+2 to Rj−1. The row decoder output signal lines Xj−1 to Xn are connected to the rows Rj+1 to Rn+2. By the above described structure, two rows of the cell array can be repaired.

When the circuit structure shown in FIG. 3 is used for the first and second switching means S1 and S2, the number of fuses to be cut is only 2, and even when the circuit structure shown in FIG. 5 is used, defective rows or columns can be repaired by eight fuses. By increasing the number of stages of the cascade connected switching elements, larger number of rows or columns can be repaired.

Actually, 2 column defects are generated mainly due to a short circuit between adjacent columns in the semiconductor memory devices. Such defects of adjacent 2 columns can be repaired by the structure shown in FIGS. 10A and 10B. A structure which can repair defects of adjacent 2 columns in a simple manner is shown in FIGS. 11A and 11B.

Figure 11A:
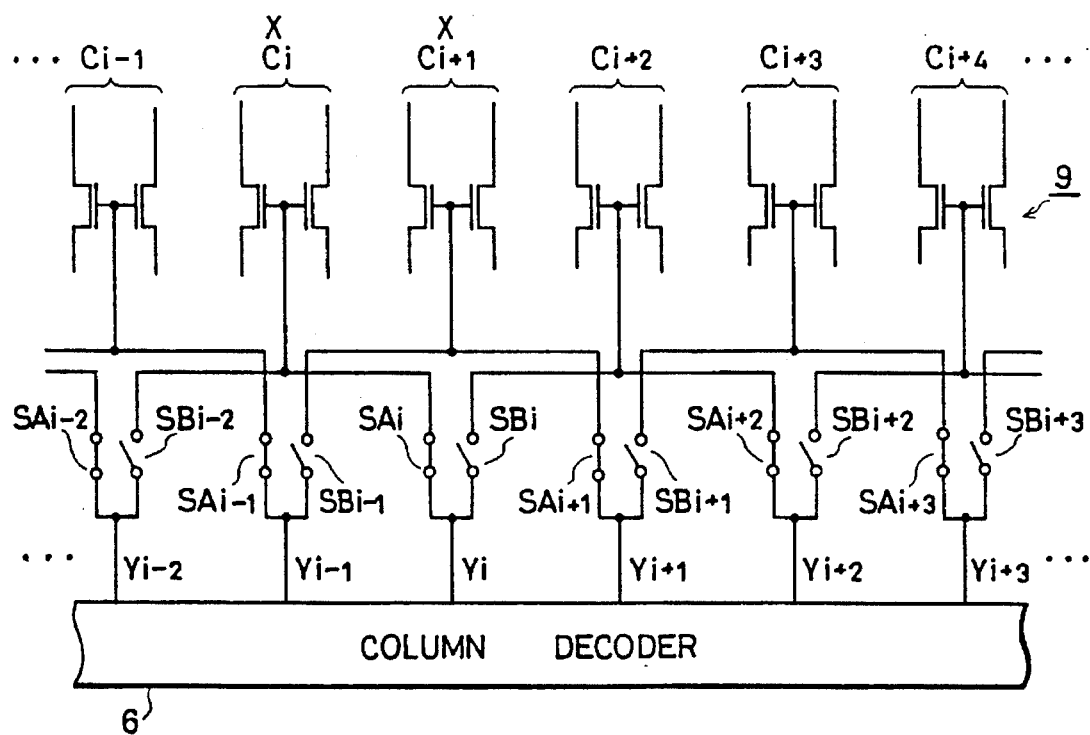
FIGS. 11A and 11B schematically show a structure of a column repairing circuit in accordance with a seventh embodiment of the present invention.
Figure 11B:
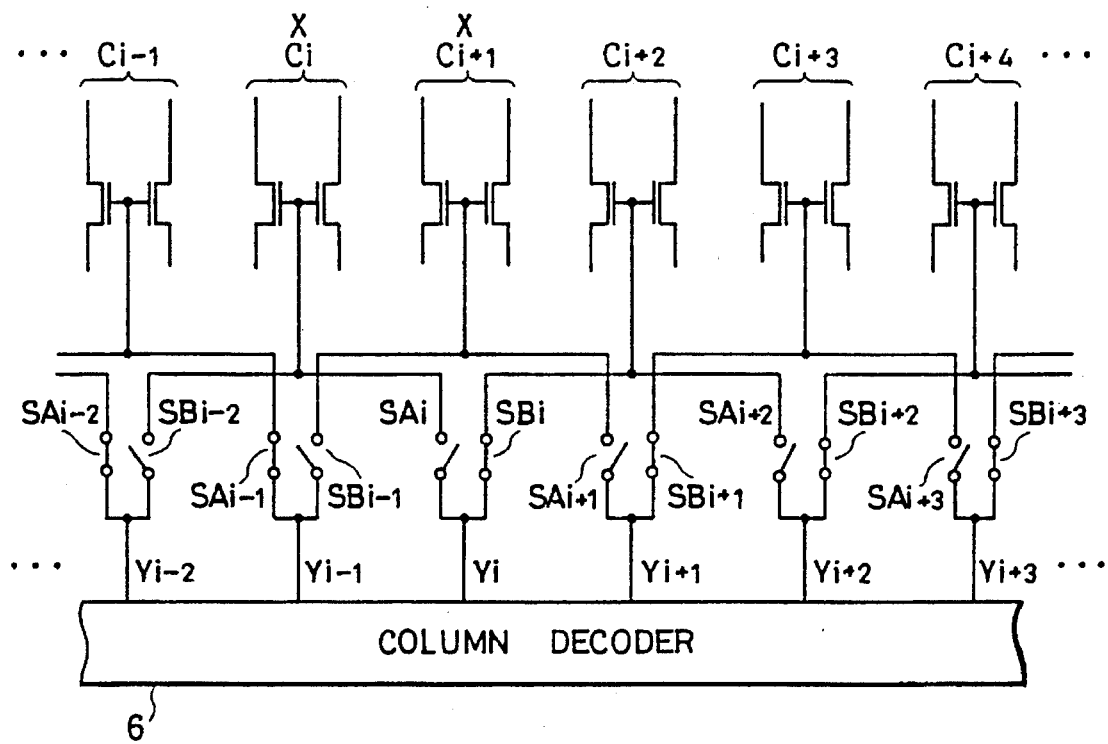

Although the switching means constituting the repairing circuit is represented by mechanical switching elements SA and SB in FIGS. 11A and 11B, the switching means can be implemented by using the circuit structure shown in FIG. 3 or 5.

Referring to FIGS. 11A and 11B, n+2 columns C1 to Cn+2 are provided for n column decoder output signal lines Y1 to Yn. In FIGS. 11A and 11B, some columns Ci−1 to Ci+4 and some column decoder output signal lines Yi− 2 to Yi∓ are shown as representatives. The output signal line Yk (k=1 to n) of the column decoder is connected to the column Ck through a switching element SAk, and to the column Ck+2 through a switching element SBk. A method of repairing columns will be described in the following.

When there is no defective memory cell, the switching elements SA1 to SAn are conductive and the switching elements SB1 to SBn are at the off state, as shown in FIG. 11A. Therefore, the output signal lines Y1 to Yn of the column decoder are connected to the columns C1 to Cn through switching elements SA1 to SAn.

Let us assume that there are defects generated on the columns Ci and Ci+1. In this case, the switching elements SBi−2 and SAi connected to the column Ci must be set to the off state and the switching elements SBi−1 and SAi+1 connected to the column Ci+1 must be set to the off state, as shown in FIG. 11B. Therefore, the switching elements SAi to SAn are turned off and the switching elements SBi to SBn are turned on. Consequently, the column decoder output signal lines Yi to Yn are connected to the column Ci+2 to Cn+2 through the switching element SBi to SBn. Meanwhile, the column decoder output signal line Y1 to Yi−1 are connected to the columns C1 to Ci−1 through the switching elements SA1 to SAi−1. By this structure, defects of adjacent 2 columns can be repaired.

The method of repairing defects of adjacent 2 columns can be applied for repairing rows.

In the first embodiment described above, the decoder output signal line is connected to two rows or two columns through one stage of switching means, whereby one row or one column can be repaired. Therefore, in order to repair a plurality of rows or columns, multiple stages of the switching means must be cascade connected, which makes the circuit structure complicated and increases the area occupied by the repairing circuit. In view of the foregoing, a structure enabling repairing of 2 rows or columns by one stage of switching means will be described in the following.

Figure 12:
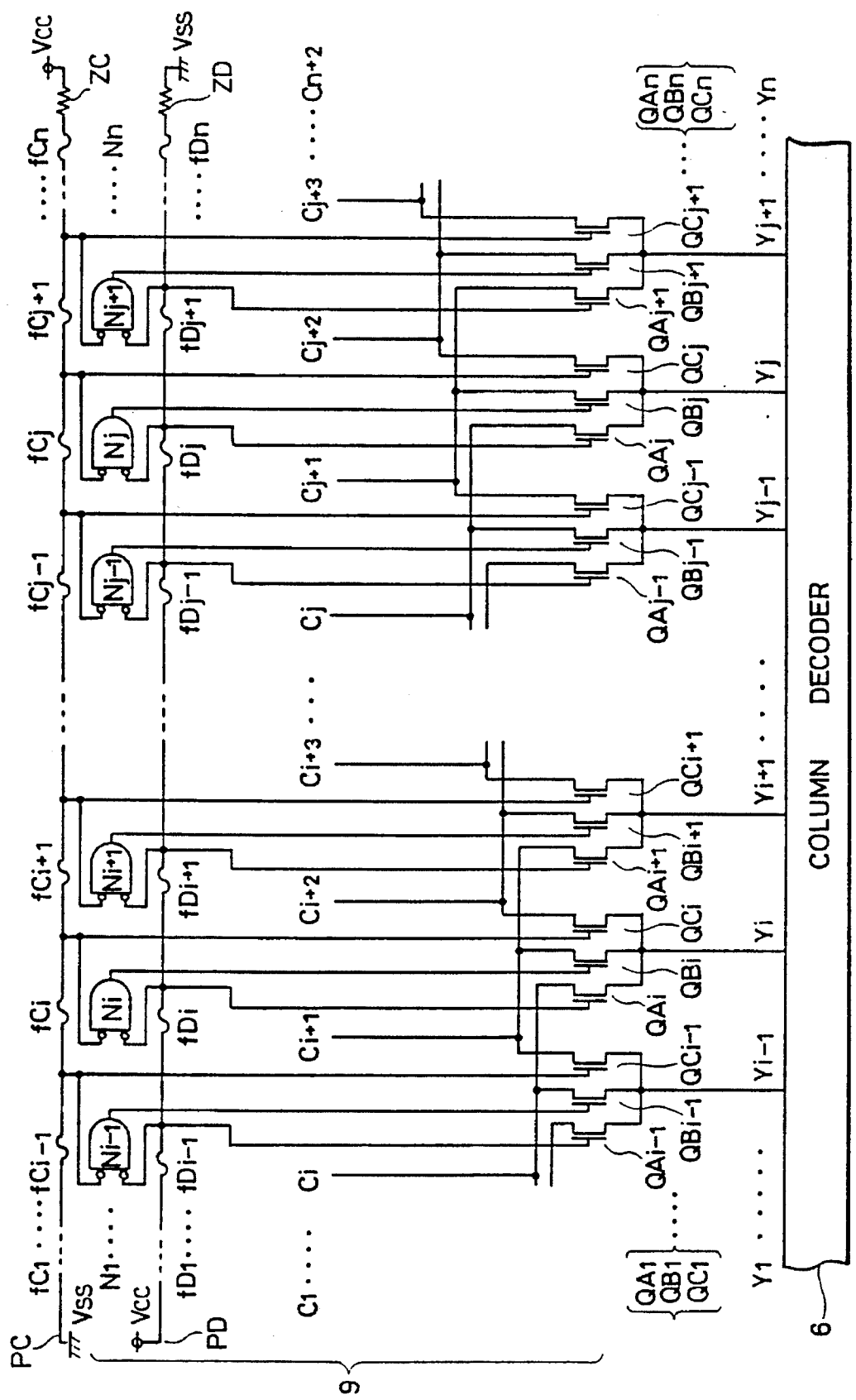
FIG. 12 shows a structure of a column repairing circuit in accordance with an eighth embodiment of the present invention.

A structure of a repairing circuit in accordance with a further embodiment of the present invention is shown in FIG. 12. Although structure of a column repairing circuit is shown in FIG. 12, the same structure can be applied to a row repairing circuit.

Referring to FIG. 12, a column decoder 6 has n output signal lines Y1 to Yn and there are n+2 columns C1 to Cn +2 in the memory cell array. A set of n type transistors QAk, QBk and QCk are provided in parallel so that the output signal line Yk of the column decoder 6 can be selectively connected to three columns Ck, Ck+1 and Ck+2. The n type transistors QA1 to QAn serve as switching means for connecting the column decoder output signal lines Y1 to Yn to the columns C1 to Cn, respectively. The n type transistors QB1 to QBn serve as switching means for connecting the column decoder output signal lines Y1 to Yn to the columns C2 to Cn+1, respectively. The n type transistors QC1 to QCn serve as switching means for connecting the column decoder output signal lines Y1 to Yn to the columns C3 to Cn+2, respectively.

In order to control the on/off operations of the n type transistors QA1 to QAn, QB1 to QBn and QC1 to QCn serving as switching means, voltage supplying paths PC and PD and NOR circuits N1 to Nn are provided. The voltage supplying path PC has one end connected to the ground potential and the other end connected to the power supply potential Vcc through a high resistance ZC. Fuses fc1 to fcn are connected in series between one end of the voltage supplying path PC and one end of the high resistance ZC. The fuse fc1 has one end connected to the ground potential and the other end connected to one end of the fuse fc2. The fuse fcn has one end connected to one end of the high resistance ZC and the other end connected to the other end of the fuse fcn−1. The fuse fci has one end connected to the gate of the n type transistor QCi and the other end connected to the gate of the n type transistor QCi−1.

The voltage supplying path PD has one end connected to the power supply potential Vcc and the other end connected to the ground potential Vss through a high resistance ZD. Fuses fD1 to fDn are arranged in series between one end and the other end of the voltage supplying path PD. The fuse fD1 has one end connected to the power supply potential. The fuse fDn has the other end connected to one end of the high resistance ZD. The fuse fDi has one end connected to the gate of the n type transistor QAi and the other end connected to the gate of the n type transistor QAi−1.

The NOR circuit Nk (k=1 to n) receives as its inputs potential on one end of the fuse fck and the potential on one end of the fuse fDk and applies an output signal to the gate of the n type transistor QBk. Namely, the voltage supplying path PC controls the on/off operations of the n type transistors QC1 to QCn, the voltage supplying path PD controls the on/off operations of the n type transistors QA1 to QAn, and the NOR circuits N1 to Nn control the on/off operations of the n type transistors QB1 to QBn. The operation will be described in the following.

When there is no defective memory in the memory cell array, the fuses fc1 to fcn and fD1 to fDn are all conductive. Therefore, the potential on the voltage supplying path PC is at the ground potential Vss level, the voltage supplying path PD is at the power supply potential Vcc level, and the outputs from the NOR circuits N1 to Nn are at the "L" level. Therefore, in this state, the n type transistors QA1 to QAn are on, and the n type transistors QB1 to QBn and QC1 to QCn are off. Consequently, the column decoder output signal lines Y1 to Yn are connected to the columns C1 to Cn through n type transistors QA1 to QAn, respectively.

Now, let us assume that there is a defective memory cell on the column Ci. On this occasion, the fuse fDi arranged on the side of the power supply potential Vcc relative to the n type transistor QAi on the voltage supplying path PD is cut off. Consequently, the portion of the voltage supplying path PD connected to the power supply potential Vcc is set to the power supply potential Vcc level, and the portion connected to the high resistance ZD is set to the ground potential Vss level. Consequently, the n type transistors QAi to QAn are all turned off. Since the potential on the voltage supplying path PC is at the ground potential Vss level at this time, the outputs from the NOR circuits Ni to Nn are all raised to the "H" level to turn on the n type transistors QBi to QBn. Consequently, the output signal lines Y1 to Yi−1 of the column decoder are connected to the columns C1 to Ci−1 through the n type transistors QA1 to QAi−1, and the output signal lines Yi to Yn are connected to the columns Ci+1 to Cn+1 through n type transistors QBi to QBn.

Now, let us assume that there is a defective memory cell on the column Cj (j>i) in addition to the one on the column Ci. In that case, the fuse fcj−1 arranged on the side of the ground potential Vss relative to the n type transistor QCj−1 on the voltage supplying path PC is further cut. By doing so, a high potential of the power supply potential Vcc level is applied through the high resistance ZC to the gates of the n type transistors QCj−1 to QCn, so that the n type transistors QCj−1 to QCn are turned on. Since one input of the NOR circuits Nj−1 to Nn is set to the power supply potential Vcc level, the output thereof attains to the ground potential Vss level, and the n type transistors KBj−1 to KBn are set to the off state. Meanwhile, the n type transistors QA1 to QAi−1, QBi to QBj−2 and QCj−1 to QCn are set to the on state. Consequently, the column decoder output signal lines Y1 to Yi−1 are connected to the columns C1 to Ci−1 through the n type transistors QA1 to QAi−1. The output signal lines Yi to Yj−2 are connected to the columns Ci+1 to Cj−1 through n type transistors QBi to QBJ−2. The column decoder output signal lines Yj−1 to Yn are connected to the columns Cj+1 to Cn+2 through n type transistors QCj−1 to QCn.

By the above described structure, the columns Ci and Cj including defective memory cells are separated from the column decoder 6, and the defective addresses can be repaired merely by cutting one fuse per one defective column.

In the structure shown in FIG. 12, the voltage supplying paths PC and PD are connected to the power supply potential Vcc and the ground potential Vss through the high resistances ZC and ZD, respectively. Instead of the high resistances ZC and ZD, potential setting circuits 27 and 28 such as shown in FIG. 13 may be used.

Figure 13:
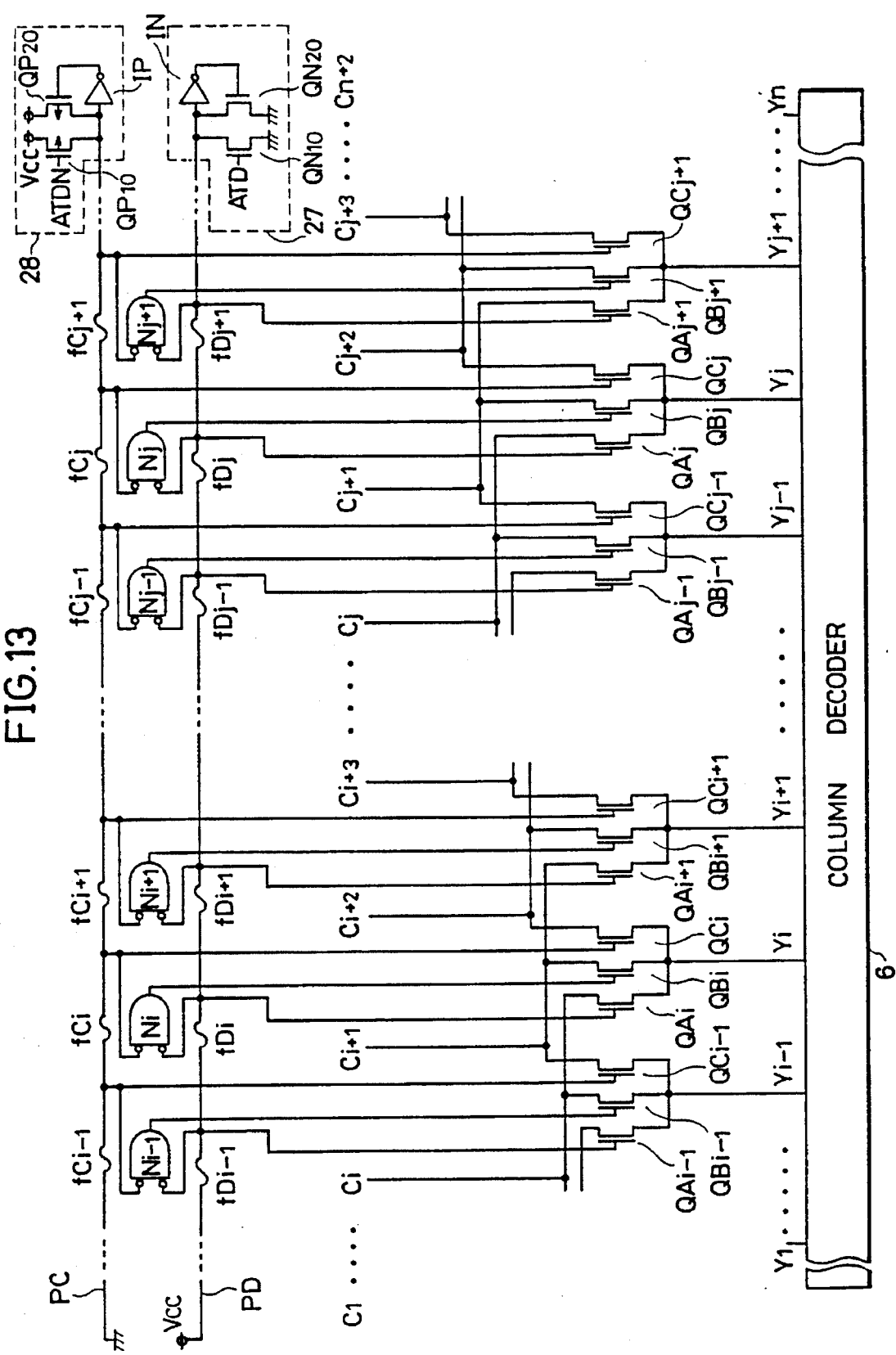
FIG. 13 shows a structure of a column repairing circuit in accordance with a ninth embodiment of the present invention.

Referring to FIG. 13, a potential setting circuit 27 is provided on the other end of the voltage supplying path PD. The potential setting circuit 27 comprises n type transistors QN10, QN20 and an inverter IN. The n type transistor QN10 is set to the on state in response to the address change detection signal ATD to connect the other end of the voltage supplying path PD to the ground potential Vss. The n type transistor QN20 is set to the on state in response to an output from the inverter IN to connect the other end of the voltage supplying path PD to the ground potential. The inverter IN inverts the potential on the other end of the power supply voltage supplying path PC to apply the same to the gate of the n type transistor QN20. The address change detection signal ATD is a pulse signal having positive polarity generated in response to an address changed, from the address transition detecting circuit (see FIG. 2). The n type transistor QN10 has a large on-resistance in order to prevent lowering of the potential of the voltage supplying path PD even if the address change detection signal ATD is generated where all the fuses fD1 to fDn are conductive. The operation will be described in the following.

When the fuses fD1 to fDn of the voltage supplying path PD are all conductive, the potential on the voltage supplying path PD is at the level of the power supply potential Vcc. At this time, the address change detection signal ATD is generated, and the n type transistor QN1 is turned on to lower the potential on the voltage supplying path PD to the ground potential Vss level. However, since the on resistance of the n type transistor QN1 is large, the potential on the voltage supplying path PD is hardly lowered, and the potential on the voltage supplying path PD is maintained at the power supply potential Vcc level.

Now, let us assume that one fuse fDk is cut in the voltage supplying path PD. In that case, the n type transistor QN1 is turned on in response to the generation of the address change detection signal ATD, and the potential of the portion of the voltage supplying path PD which is cut away from the power supply potential Vcc is lowered to the ground potential Vss level. When the potential of the portion cut away from the power supply potential Vcc exceeds the threshold value of the inverter IN, the output from the inverter IN attains to the "H" level, the n type transistor QN2 is turned on, and the potential of the separated portion is quickly discharged to the ground potential Vss level. The potential of the portion cut away from the power supply potential Vcc is latched to the ground potential Vss level by a latch circuit of the inverter IN and the n type transistors QN2. Consequently, the circuit portion cut away from the power supply potential Vcc in the voltage supplying path PD is surely set to the ground potential Vss level at high speed.

A potential setting circuit 28 is provided for the voltage supplying path PC. The potential setting circuit 28 comprises p type transistors QP10 and QP20 and an inverter IP. The p type transistor PQ10 is turned on in response to an address change detection signal ATDN of negative polarity to connect the other end of the voltage supplying path PC to the power supply potential Vcc level. The p type transistor QP20 is turned on in response to an output from the inverter IP to connect the other end of the voltage supplying path PC to the power supply voltage Vcc. The inverter IP inverts the potential on the other end of the voltage supplying path PC to apply the same to the gate of the p type transistor QP20. The address change detection signal ATDN is a pulse signal of negative polarity generated when there is a change in the address, which falls to the "L" level at the time of change of the address. The p type transistor QP10 has a large on-resistance. Consequently, the potential of the voltage supplying path PC is not raised even when the p type transistor QP10 is turned on with all the fuses fc1 to fcn being on. When any one of the fuses fc1 to fcn is cut, the p transistor QP10 is turned on in response to the address change detection signal ATDN to raise the potential of the circuit portion cut away from the ground potential Vss. When the potential of the portion cut away from the ground potential Vss exceeds the threshold voltage of the inverter IP, the p type transistor QP20 is turned on to charge this portion to the power supply potential Vcc level quickly. The p type transistor QP20 and the inverter IP constitute a latch circuit, which sets the portion cut away from the ground potential Vss of the second voltage supplying path PC to the power supply potential Vcc level.

By this potential setting setting circuits 27 and 28, the ground potential Vss and the power supply potential Vcc can be quickly and stably supplied to the first and second voltage supplying paths PD and PC, respectively, in repairing defective addresses.

In the structure shown in FIGS. 12 and 13, when the fuses fD1 to fDn are all conductive, the potential of the voltage supplying path PD is set to the power supply potential Vcc. However, as shown in FIG. 14, a structure in which the potential of the voltage supplying path PD is set to the ground potential Vss with the fuses fD1 to fDn being all conductive may be used.

Figure 14:
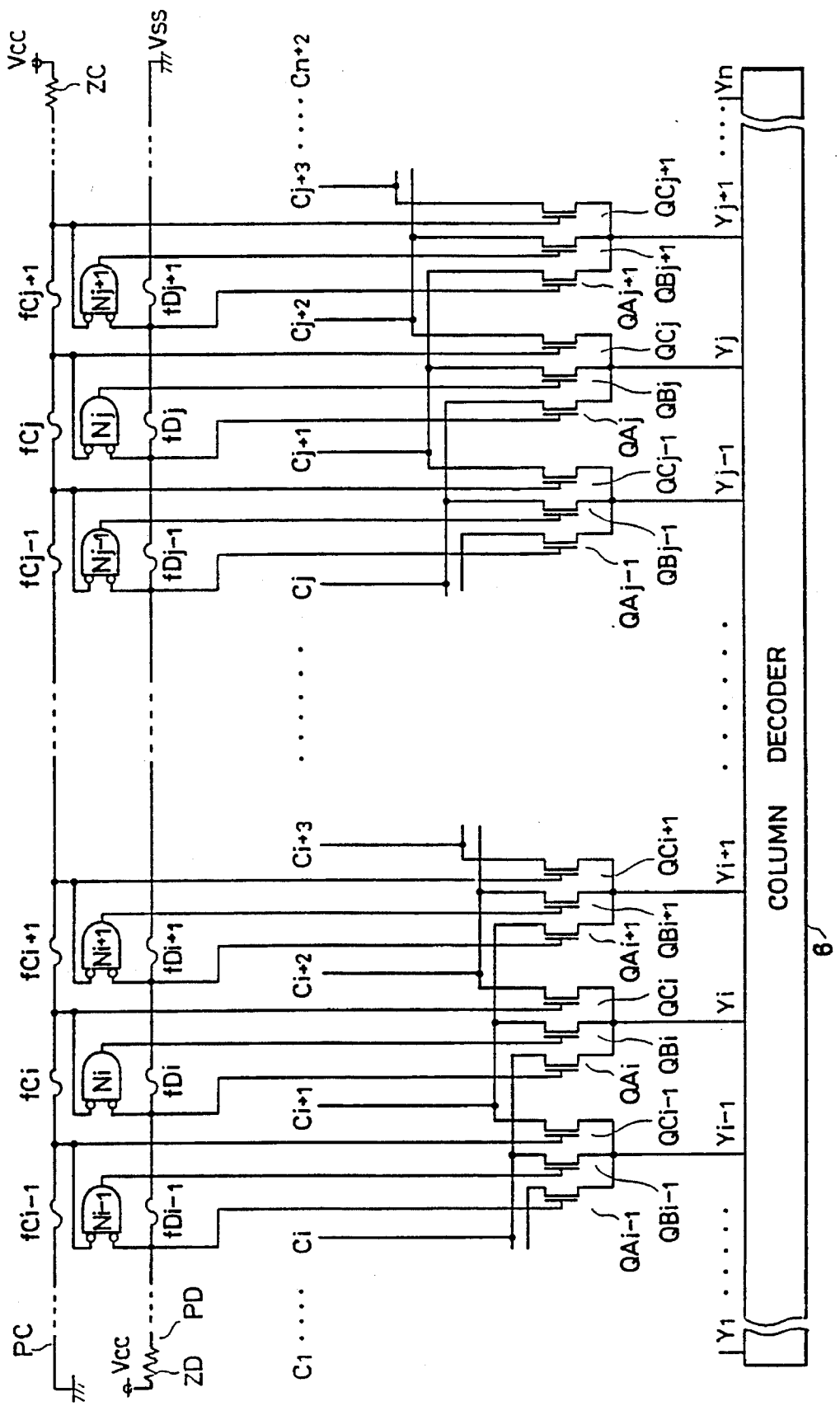
FIG. 14 shows a structure of a column repairing circuit in accordance with a tenth embodiment of the present invention.

Referring to FIG. 14, the voltage supplying path PD has one end connected to the power supply voltage Vcc through a high resistance ZD. Fuses fD1 to fDn are connected in series between one end of the voltage supplying path PD and the ground potential Vss. The structure of the voltage supplying path PC is the same as that shown in FIG. 12. The operation will be described in the following.

When there is no defective memory cell, the ground potential Vss is always supplied to the voltage supplying path PD, and the n type transistors QA1 to QAn are off. Meanwhile, the NOR circuits N1 to Nn output signals of the first potential Vss level, since the inputs are at the ground potential Vss level. Consequently, n type transistors QB1 to QBn are set to the on state. Accordingly, the column decoder output signal lines Y1 to Yn are connected to the columns C2 to Cn+1 through n type transistors QB1 to QBn.

Now, let us assume that there is a defective memory cell on the column Ci. In that case, the fuse fDi-1 on the voltage supplying path PD is cut. Consequently, the power supply potential Vcc is applied through the high resistance ZD to the gates of the n type transistors QA1 to QAi-1, so that the n type transistors QA1 to QAi-1 are turned on. Each of the NOR circuits N1 to Ni-1 outputs a signal of the ground potential Vss level, as one of the inputs thereof is raised to the power supply potential Vcc, so as to set the n type transistors QB1 to QBi-1 to the off state. Consequently, the column decoder output signal lines Y1 to Yi-1 are connected to the columns C1 to Ci-1 through the n type transistors QA1 to QAi-1. At that time, the remaining column decoder output signal lines Yi to Yn are connected to the columns Ci+1 to Cn+1 through the n type transistors QBi to QBn which are at the on state.

Let us assume that there is another defective memory cell on the column Cj (j>i). In that case, what have to be done is only to cut the fuse fcj-1 of the voltage supplying path PC, as in the case shown in FIG. 12. Consequently, the output signal level from each of the NOR circuits Nj-1 to Nn attains the "L" level, so that the n type transistors QBj-1 to QBn are turned off, while the n type transistors QCj-1 to QCn are all turned on. Consequently, the column decoder output signal lines Y1 to Yi-1 are connected to the columns C1 to Ci-1 through the n type transistors QA1 to QAi-1. The output signal lines Yi to Yj-2 are connected to the columns Ci to Cj -1 through the n type transistors QBi to QBj-2. The output signal lines Yj to Yn are connected to the columns Cj+1 to Cn+2 through the n type transistors QCj-1 to QCn.

In the structure shown in FIG. 14, the defective columns can be repaired by cutting one fuse per one defective column. In the structure shown in FIG. 14, the potential setting circuit 28 shown in FIG. 13 may be used instead of the first and second high resistances ZC and ZD.

Although repair of columns was shown in FIGS. 12 to 14, a repairing circuit having the same structure can be used for repairing rows. When the circuit is used for repairing rows, it is not necessary to inactivate the row decoder 3 by the signal NED, so that the row including a defective cell is never selected, reducing the access time.

Figure 15:
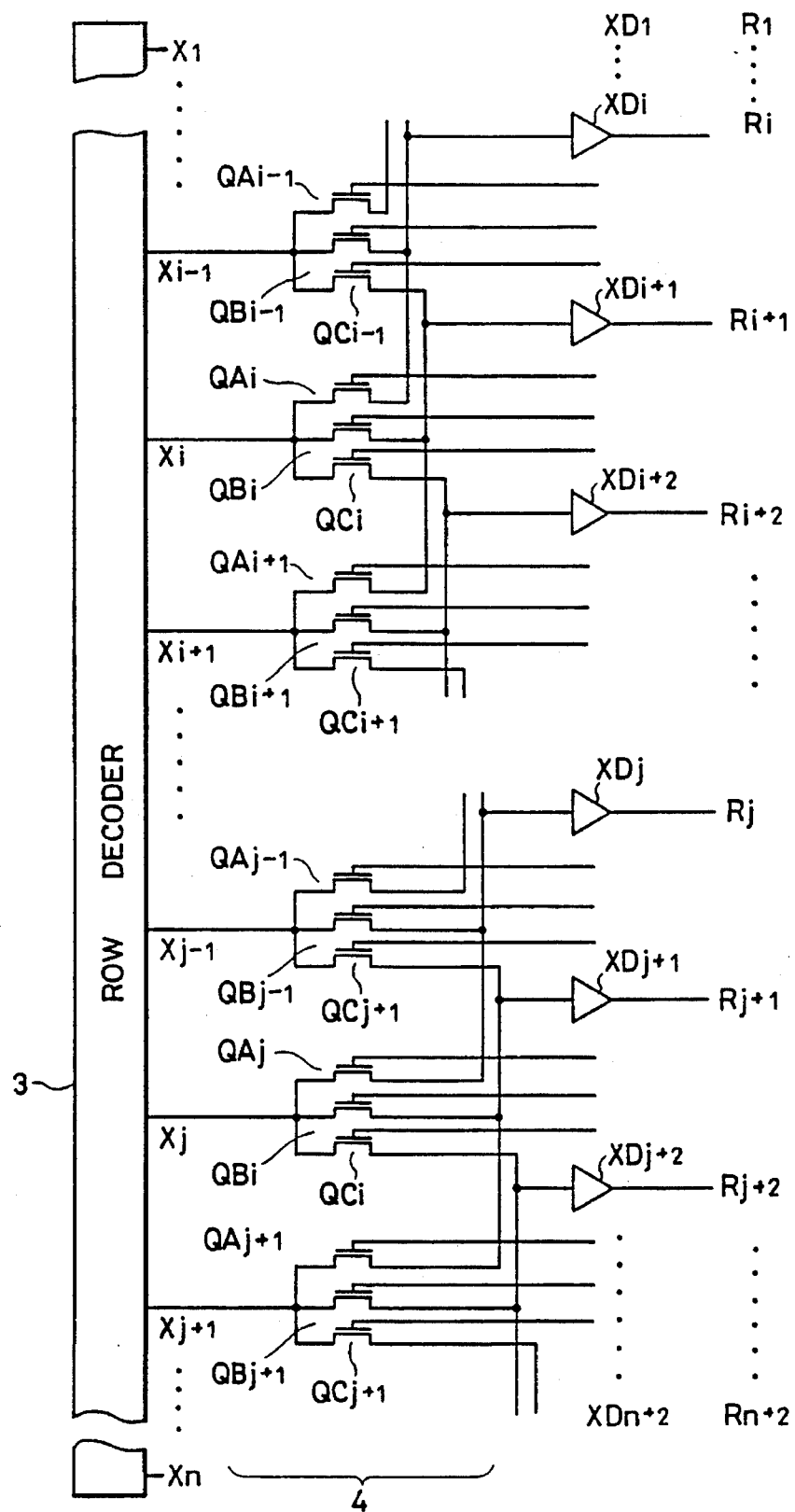
FIG. 15 shows a structure of a row repairing circuit in accordance with an eleventh embodiment of the present invention.

FIG. 15 shows a modification of the structure shown in FIGS. 12 to 14 used for repairing rows. Referring to FIG. 15, the row decoder 3 comprises output signal lines X1 to Xn, and n+2 rows R1 to Rn+2 are provided corresponding thereto. Switching elements QA1 to QAn, QB1 to QBn and QC1 to QCn for the repairing circuit are arranged between the row decoder output signal lines X1 to Xn and the rows R1 to Rn+2. The switching element (n type transistor) QAk connects the row decoder output signal line Xk to the row Rk. The n type transistor QBk connects the row decoder output signal line Xk to the row Rk+1. The n type transistor QCk connects the row decoder output signal line Xk to the row Rk+2. Although the switching element portion only is shown in this structure, the voltage supplying paths, fuses and NOR circuits are arranged as in the structure shown in FIGS. 12 to 14.

The output from the row decoder 3 drives the rows R1 to Rn+2 through the switching element QAk, QBk and QCk, and therefore there may be a problem of increase of the access time, as the row can not be driven at high speed when the amplitude of the output signal is reduced. In view of the foregoing, row drivers XD1 to XDn+2 are arranged between the respective rows R1 to Rn+2, and the switching element QA1 to QAn, QB1 to QBn and QC1 to QCn, respectively. The row drivers XD1 to XDn+2 are formed using a buffer amplifier known in the art. By providing the row driver XDk, driving of the selected row in response to the output from the row decoder 3 at high speed becomes possible, realizing high speed operation of the semiconductor memory device.

The conductivity type of the switching transistors in the repairing circuit of the above described embodiments can be changed to the opposite type by changing the voltage polarity of the voltage supplying paths and the arrangement of fuses.

As described above, according to the present invention, each of the row or column decoder output signal lines is selectively connected to one of a plurality of rows or columns through switching means and each of the decoder output signal line is connected to a normal row or column and not to a defective row or column by simply switching the manner of connection of the switching means, so that a programing circuit storing the defective row or defective column and the spare decoder for selecting a spare row or a spare column which were conventionally necessary for repairing the row or column become unnecessary, whereby the area of the chip required for the repairing circuit can be reduced, and a semiconductor memory device having higher degree of integration can be provided.

In addition, selection of a defective row by the activation of the row decoder or column decoder is not generated, so that the row selection can be carried out at high speed, reducing the access time.

In addition, switching of the manner of connection of the switching means can be carried out by cutting several fuses (one at a minimum), so that the throughput and the success rate of repairing can be improved in the repairing process, thereby improving the production yield of the semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device with redundant memory cells, comprising:

a plurality of memory cells arranged in a matrix of (n+2) rows and m columns;

(n+2) row lines arranged in said (n+2) rows, each row line having connected thereto memory cells arranged in a corresponding row;

m column lines arranged in said m columns, each column line having connected thereto memory cells arranged in a corresponding column;

row decoder means receiving row address signals and having n output lines, and for selecting one of said n output lines in accordance with received row address signals;

column decoder means responsive to column address signals for selecting a column line of said m column lines;

n connecting means, one for each output line of said row decoder means, provided between said n output lines of said row decoder means and said (n+2) row lines, each said connecting means including a first transistor element having a first conduction terminal connected to a corresponding output line of said row decoder means and a second conduction terminal connected to a row line arranged in a related row, and a second transistor having a first conduction terminal connected to said corresponding output line of said row decoder means and a second conduction terminal connected to a row line arranged in a next nearest row in a physical sequence with respect to said related row; and selecting means for setting one of the first and second transistor elements of each connecting means in a conductive state, and for setting the other of the first and second transistor elements in a non-conductive state.

2. A semiconductor memory device with redundant memory cells comprising:

a plurality of memory cells arranged in a matrix of n rows and (m+2) columns;

n row lines arranged in said n rows, each row line having connected thereto memory cells arranged in an associated row;

(m+2) column lines arranged in said (m+2) columns, each column line having connected thereto memory cells arranged in an associated column;

row decoder means responsive to row address signals for selecting a row line of said n row lines;

column decoder means receiving column address signals and having m output lines, and for selecting an output line of said m output lines;

(m+2) transfer gate means arranged in (m+2) columns, one for each of said (m+2) column lines;

m connecting means, one for each output line of said column decoder means, each said connecting means including a first transistor element having a first conduction terminal connected a corresponding output line of said column decoder means and a second conduction terminal connected to a control gate of a transfer gate means arranged in a corresponding column, and a second transistor element having a first conduction terminal connected to said corresponding output line of said column decoder means and a second conduction terminal connected to a control gate of a transfer gate means arranged in a next nearest column with respect to said corresponding column; and selecting means for setting one of the first and second transistor elements of each connecting means in a conductive state, and for setting the other of the first and second transistor elements of each connecting means in a non-conductive state.

* * * * *